(12) United States Patent
Chun et al.

(10) Patent No.: US 9,461,007 B2
(45) Date of Patent: Oct. 4, 2016

(54) WAFER-TO-WAFER BONDING STRUCTURE

(71) Applicant: Samsung Electronics Co., Ltd., Suwon-si, Gyeonggi-do (KR)

(72) Inventors: Jin-ho Chun, Seoul (KR); Pil-kyu Kang, Anyang-si (KR); Byung-lyul Park, Seoul (KR); Jae-hwa Park, Yongin-si (KR); Ju-il Choi, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/796,506

(22) Filed: Jul. 10, 2015

(65) Prior Publication Data

US 2016/0013160 A1    Jan. 14, 2016

(30) Foreign Application Priority Data

Jul. 11, 2014    (KR) .......................... 10-2014-0087620

(51) Int. Cl.
*H01L 23/528*    (2006.01)
*H01L 23/00*    (2006.01)
(Continued)

(52) U.S. Cl.
CPC ........... *H01L 24/08* (2013.01); *H01L 23/3192* (2013.01); *H01L 23/53238* (2013.01); *H01L 25/50* (2013.01); *H01L 23/5283* (2013.01); *H01L 23/53295* (2013.01); *H01L 2224/05025* (2013.01); *H01L 2224/05147* (2013.01); *H01L 2224/08145* (2013.01); *H01L 2224/94* (2013.01); *H01L 2225/06513* (2013.01); *H01L 2225/06548* (2013.01); *H01L 2924/06* (2013.01); *H01L 2924/0695* (2013.01); *H01L 2924/07025* (2013.01)

(58) Field of Classification Search
CPC ........... H01L 25/0657; H01L 23/5226; H01L 23/5283; H01L 23/53238; H01L 23/53295; H01L 24/08; H01L 2225/06548; H01L 224/08145; H01L 2224/05025; H01L 2224/05147; H01L 2224/07025; H01L 2924/07025; H01L 2924/0695; H01L 2924/06
USPC ........ 257/751, 211, 758, 773, 775, E23.011, 257/E23.079, E23.145, E23.151
See application file for complete search history.

(56) References Cited

U.S. PATENT DOCUMENTS 6,260,264 B1    7/2001    Chen et al.
6,924,171 B2    8/2005    Buchwalter et al.
(Continued)

FOREIGN PATENT DOCUMENTS

JP    2010-287835    12/2010
KR    1020060079316    7/2006
KR    102012013645    12/2012

*Primary Examiner* — Alexander Oscar Williams
(74) *Attorney, Agent, or Firm* — Myers Bigel & Sibley, P.A.

(57) ABSTRACT

A wafer-to-wafer bonding structure may include: a first wafer including a first insulating layer on a first substrate and on a first copper (Cu) pad that penetrates the first insulating layer and has portions protruding from an upper surface of the first insulating layer, and a first barrier metal layer on a lower surface and sides of the first Cu pad; a second wafer including a second insulating layer on a second substrate and on a second copper (Cu) pad that penetrates the second insulating layer, has portions protruding from an upper surface of the second insulating layer, and is bonded to the first Cu pad, and a second barrier metal layer on a lower surface and sides of the second Cu pad; and a polymer layer covering protruding sides of the first and second barrier metal layers and disposed between the first and second wafers.

20 Claims, 19 Drawing Sheets

(51) Int. Cl.
 *H01L 23/532* (2006.01)
 *H01L 23/31* (2006.01)
 *H01L 25/00* (2006.01)

(56) References Cited

U.S. PATENT DOCUMENTS

| | | |
|---|---|---|
| 6,962,835 B2 | 11/2005 | Tong et al. |
| 8,030,200 B2 | 10/2011 | Eom et al. |
| 8,120,168 B2 | 2/2012 | Apanius et al. |
| 8,541,819 B1 * | 9/2013 | Or-Bach .............. H01L 29/7841 257/211 |
| 8,551,813 B2 | 10/2013 | Lee et al. |
| 8,617,689 B2 | 12/2013 | Chen et al. |
| 2007/0102786 A1 * | 5/2007 | Ido ...................... H01L 23/5258 257/529 |
| 2010/0025824 A1 * | 2/2010 | Chen ..................... H01L 23/585 257/620 |
| 2010/0193953 A1 * | 8/2010 | Amano ............. H01L 21/76831 257/751 |
| 2012/0199981 A1 * | 8/2012 | Jeong .................... H01L 23/481 257/774 |
| 2013/0062777 A1 * | 3/2013 | Ogata ..................... H01L 24/05 257/774 |
| 2013/0105558 A1 | 5/2013 | Abe et al. |
| 2015/0076649 A1 * | 3/2015 | Kim .................. H01L 27/14609 257/446 |
| 2015/0348905 A1 * | 12/2015 | Tsai .................. H01L 21/76898 257/774 |
| 2015/0348917 A1 * | 12/2015 | Tsai .................. H01L 21/76898 257/774 |
| 2016/0035722 A1 * | 2/2016 | Or-Bach ................ H01L 29/456 257/504 |

* cited by examiner

WAFER-TO-WAFER BONDING STRUCTURE

CROSS-REFERENCE TO RELATED APPLICATIONS

This application claims the benefit of Korean Patent Application No. 10-2014-0087620, filed on Jul. 11, 2014, in the Korean Intellectual Property Office, the disclosure of which is incorporated by reference herein in its entirety.

BACKGROUND

The inventive concepts relate to semiconductor devices, and more particularly, to a wafer-to-wafer bonding substrate in which a wafer is bonded to another wafer.

With regard to methods of bonding wafers, copper (Cu) pads may be formed on bonding surfaces of two wafers and the wafers may be bonded together by connecting the Cu pads. When the Cu pads are bonded to each other, a predetermined bonding force may be needed to be secured, and accordingly, a dummy pattern may be formed and may be used to bond wafers. However, a ratio of the dummy pattern may be high and, therefore, a bonding defect in the dummy pattern may occur and gaps and/or voids may be generated in a bonded portion. As a result, defects caused by the gaps and/or voids may occur.

SUMMARY

The inventive concepts provide a wafer-to-wafer structure in which a predetermined bonding force may be maintained without a dummy pattern and defects caused by gaps and/or voids may be reduced or prevented.

According to some embodiments of the inventive concepts, wafer-to-wafer bonding structures are provided. A wafer-to-wafer bonding structure may include a first wafer including a first insulating layer on a first substrate and on a first copper (Cu) pad that penetrates the first insulating layer and has portions protruding from an upper surface of the first insulating layer, and a first barrier metal layer on a lower surface and sides of the first Cu pad. The wafer-to-wafer bonding structure may include a second wafer including a second insulating layer on a second substrate and on a second copper (Cu) pad that penetrates the second insulating layer, has portions protruding from an upper surface of the second insulating layer, and is bonded to the first Cu pad, and a second barrier metal layer on a lower surface and sides of the second Cu pad. The wafer-to-wafer bonding structure may include a polymer layer covering protruding sides of the first and second barrier metal layers and disposed between the first and second wafers.

The polymer layer may include a first polymer layer on the first wafer and a second polymer layer on the second wafer that are bonded to each other.

The polymer layer may include at least one material selected from the group consisting of polyimide, polyamide, polyacrylate, and polyaramide.

The polymer layer may have a hardness of 90% or above.

The polymer layer may be on edges and/or bevel areas, between the first and second wafers.

The first wafer may include a first multilayer wiring structure on the first substrate. The second wafer may include a second multilayer wiring structure on the second substrate. The first insulating layer may be on the first multilayer wiring structure, and the second insulating layer may be on the second multilayer wiring structure. The first Cu pad may be electrically connected to the first multilayer wiring structure, and the second Cu pad may be electrically connected to the second multilayer wiring structure.

The first and second insulating layers may respectively include a multilayer structure including one or more alternately stacked nitride layers and oxide layers.

At least one of the first and second insulating layers may include a first silicon carbon nitride (SiCN) layer, a first tetraethyl orthosilicate (TEOS) layer, and a second SiCN layer that are sequentially stacked.

The at least one of the first and second insulating layers may further include a second TEOS layer on the second SiCN layer.

The first Cu pad may include a first upper Cu pad and a first lower Cu pad. The second Cu pad may include a second upper Cu pad and a second lower Cu pad. The first barrier metal layer may include a first lower barrier metal layer on a lower surface and sides of the first lower Cu pad and a first upper barrier metal layer on a lower surface and sides of the first upper Cu pad. The second barrier metal layer may include a second lower barrier metal layer on a lower surface and sides of the second lower Cu pad and a second upper barrier metal layer on a lower surface and sides of the second upper Cu pad.

The polymer layer may cover portions of sides of the first and second upper barrier metal layers.

According to some embodiments of the inventive concepts, wafer-to-wafer bonding structures are provided. A wafer-to-wafer bonding structure may include a first substrate, a first multilayer wiring structure on the first substrate, a first insulating layer on the first multilayer wiring structure, a polymer layer on the first insulating layer, a second insulating layer on the polymer layer, a second multilayer wiring structure on the second insulating layer, a second substrate on the second multilayer wiring structure, a copper (Cu) pad that penetrates the first insulating layer, the polymer layer, and barrier metal layers between the Cu pad and the first insulating layer, the polymer layer, and the second insulating layer, and barrier metal layers between the Cu pad and the first insulating layer, the polymer layer, and the second insulating layer.

Sides of the barrier metal layers may be on sides of the Cu pad. The polymer layer may be on portions of the sides of the barrier metal layers.

The barrier metal layers may be on lower and upper surfaces of the Cu pad. The Cu pad may be electrically connected to the first multilayer wiring structure through a first of the barrier metal layers on the lower surface of the Cu pad and may be electrically connected to the second multilayer wiring structure through a second of the barrier metal layers on the upper surface of the Cu pad.

The Cu pad may include a lower Cu pad having a first width, an intermediate Cu pad having a second width, and an upper Cu pad having a third width. The barrier metal layers may include a lower barrier metal layer on portions of the lower Cu pad, intermediate barrier metal layers on portions of the intermediate Cu pad, and an upper barrier metal layer on portions of the upper Cu pad. The polymer layer may be on the intermediate barrier metal layers on portions of sides of the intermediate Cu pad.

The first width may be substantially the same as the third width, and the second width may be smaller than the first width. The barrier metal layers may be respectively between the lower Cu pad and the intermediate Cu pad and between the intermediate Cu pad and the upper Cu pad.

The first integrated circuit layer, the first multilayer wiring structure, the first insulating layer, and portions of the polymer layer may be based on the first wafer. The second integrated circuit layer, the second multilayer wiring structure, the second insulating layer, and the other portions of the polymer layer may be based on the second wafer. The polymer layer may be on an entire area including edges of the first and second wafers and/or the bevel area.

According to some embodiments of the inventive concepts, wafer-to-wafer bonding structures are provided. A wafer-to-wafer bonding structure may include a first wafer that includes a first copper (Cu) pad which has a lower surface and sides covered by a first barrier metal layer and an upper surface which is exposed, a first insulating layer which covers sides of the first barrier metal layer but is on a lower level than the first barrier metal layer, and a first polymer layer which is on the first insulating layer to cover the sides of the first barrier metal layer that are exposed. The first polymer layer may have an upper surface on the same level as the upper surface of the first Cu pad. The wafer-to-wafer bonding structure may include a second wafer that includes a second Cu pad that has a lower surface and sides covered by a second barrier metal layer and an upper surface that is exposed, a second insulating layer that covers sides of the second barrier metal layer but is on a lower level than the second barrier metal layer, and a second polymer layer that is on the second insulating layer to cover the sides of the second barrier metal layer that are exposed. The second polymer layer may have an upper surface on the same level as the upper surface of the second Cu pad. The first and second wafers may have a structure in which the first Cu pad and the second Cu pad are bonded to each other, and the first polymer layer and the second polymer layer are bonded to each other.

Each of the first and second wafers may include a substrate and a multilayer wiring structure. The first insulating layer may be on the multilayer wiring structure of the first wafer, and the second insulating layer may be on the multilayer wiring structure of the second wafer. The first Cu pad may penetrate the first insulating layer and may be electrically connected to the multilayer wiring structure of the first wafer, and the second Cu pad may penetrate the second insulating layer and may be electrically connected to the multilayer wiring structure of the second wafer.

Each of the first and second Cu pads may include an upper Cu pad and a lower Cu pad, and each of the first and second barrier metal layers may include a lower barrier metal layer that covers a lower surface and sides of the lower Cu pad, and an upper barrier metal layer that covers a lower surface and sides of the upper Cu pad. Each of the first and second polymer layers may cover sides of the upper barrier metal layer which respectively correspond to the first and second polymer layers, and each upper surface of the first and second polymer layers may be on the same level as the upper surface of the upper Cu pad that corresponds to each of the first and second polymer layers.

According to some embodiments of the inventive concepts, wafer-to-wafer bonding structures are provided. A wafer-to-wafer bonding structure may include a first substrate, a first interlayer insulating layer on the first substrate and comprising a first wiring structure, a first nitride layer on the first interlayer insulating layer, a first oxide layer on the first nitride layer, a second nitride layer on the first oxide layer, a polymer layer on the second nitride layer, a third nitride layer on the polymer layer, a second oxide layer on the third nitride layer, a fourth nitride layer on the second oxide layer, a second interlayer insulating layer on the fourth nitride layer and comprising a second wiring structure, and a second substrate on the second interlayer insulating layer. The wafer-to-wafer bonding structure may include a copper (Cu) pad extending within the second nitride layer, the polymer, layer, and the third nitride layer and electrically connected to the first wiring structure and the second wiring structure. The wafer-to-wafer bonding structure may include a barrier metal layer between the Cu pad and the second nitride layer, the polymer, layer, and the third nitride layer. The polymer layer may be configured to provide a bonding force.

The polymer layer may include a polymer that is configured to bond to another polymer layer, reflow, and crystallize at a temperature of a copper bonding thermal treatment.

The wafer-to-wafer bonding structure may include a third oxide layer between the second nitride layer and the polymer layer and a fourth oxide layer between the polymer layer and the third nitride layer. A bottom surface of the Cu pad may be within the first oxide layer. A top surface of the Cu pad adjacent the second substrate may be within the second oxide layer.

The Cu pad may include a first portion including a first width within the polymer layer, a second portion including a second width smaller than the first width between the first portion of the Cu pad and the first wiring structure, and a third portion including a third width smaller than the first width between the first portion of the Cu pad and the second wiring structure. Bottom and top surfaces of the barrier metal layer may contact respective portions of the first and second wiring structures.

The Cu pad may be a first Cu pad and the barrier metal layer may be a first barrier metal layer. The wafer-to-wafer bonding structure may include a second Cu pad extending between the first wiring structure and a portion of the barrier metal layer on a bottom surface of the first Cu pad, a second barrier metal layer on sides and a bottom surface of the second Cu pad adjacent the first wiring structure, a third Cu pad extending between the second wiring structure and a portion of the barrier metal layer on a top surface of the first Cu pad, and a third barrier metal layer on sides and a top surface of the third Cu pad adjacent the second wiring structure.

It is noted that aspects of the inventive concepts described with respect to one embodiment may be incorporated in a different embodiment although not specifically described relative thereto. That is, all embodiments and/or features of any embodiment can be combined in any way and/or combination. These and other objects and/or aspects of the present inventive concepts are explained in detail in the specification set forth below.

BRIEF DESCRIPTION OF THE DRAWINGS

Example embodiments of the inventive concepts will be more clearly understood from the following detailed description taken in conjunction with the accompanying drawings.

DETAILED DESCRIPTION OF THE EMBODIMENTS

Figure 1:
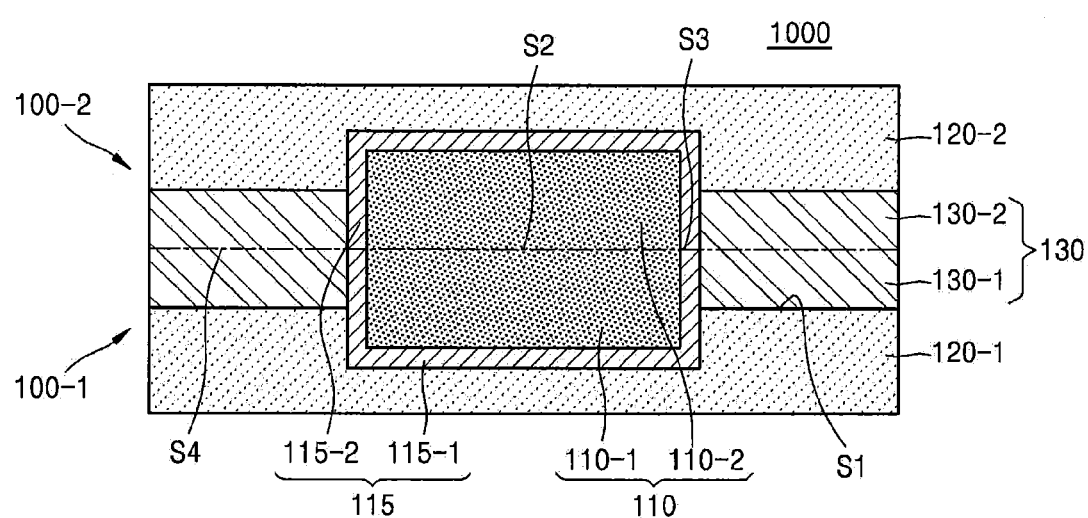
FIG. 1 is a schematic cross-sectional view illustrating a wafer-to-wafer bonding structure according to some embodiments the inventive concepts.

Various embodiments of the present invention will now be described more fully with reference to the accompanying drawings, in which some embodiments of the invention are shown. The invention may, however, be embodied in many different forms and should not be construed as being limited to the embodiments set forth herein; rather, these embodiments are provided so that this disclosure will be thorough and complete, and will fully convey the concepts of the invention to those skilled in the art.

It will be understood that when an element or layer is referred to as being "connected to," or coupled to" another element or layer, it can be directly connected to or coupled to the other element or layer or intervening elements or layers may be present. In contrast, when an element is referred to as being "directly connected to" or "directly coupled to" another element or layer, there are no intervening elements or layers present. Similarly, when an element or layer is referred to as being "formed on" another element or layer, it can be directly formed on the other element or layer or intervening elements or layers may be present. In the drawings, the thicknesses of layers and regions may be exaggerated for clarity. Like reference numerals in the drawings denote like elements, and thus their description may be omitted. As used herein, the term "and/or" includes any and all combinations of one or more of the associated listed items.

It will also be understood that when a layer is referred to as being "on" another element or layer, it can be directly on the other element or layer, or intervening elements or layers may also be present. In contrast, when an element is referred to as being "directly on" another element or layer, there are no intervening elements or layers present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concepts.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of devices may be arranged in an array and/or in a two-dimensional pattern.

FIG. 1 is a schematic cross-sectional view illustrating a wafer-to-wafer bonding structure 1000 according to some embodiments of the inventive concepts.

Referring to FIG. 1, the wafer-to-wafer bonding structure 1000 may have a structure in which a first wafer 100-1 and a second wafer 100-2 are bonded to each other.

The first wafer 100-1 may include a first insulating layer 120-1, a first Cu pad 110-1, a first barrier metal layer 115-1, and a first polymer layer 130-1. In some embodiments, the first wafer 100-1 may include the first insulating layer 120-1, the first Cu pad 110-1, and the first barrier metal layer 115-1, and the first polymer layer 130-1 may be classified as a layer that is separate from the first wafer 100-1. Hereinafter, the first polymer layer 130-1 is included in the first wafer 100-1 for convenience.

The first insulating layer 120-1 may be a nitride layer and/or an oxide layer. The first insulating layer 120-1 may be a single layer or multiple layers. For example, in some embodiments, when the first insulating layer 120-1 is multiple layers, the first insulating layer 120-1 may have a structure in which a first silicon carbon nitride (SiCN) layer, a first tetraethyl orthosilicate (TEOS) layer, and a second SiCN layer are sequentially stacked. Also, the first insulating layer 120-1 may include a first SiCN layer, a first TEOS layer, a second SiCN layer, and a second TEOS layer. Descriptions about a structure of the first insulating layer 120-1 are further provided with reference to FIGS. 4 through 5H.

In some embodiments, the first insulating layer 120-1 may be formed on a substrate. The substrate may include, for example, an integrated circuit layer and a multilayer wiring structure. An interlayer insulating layer may be disposed between the integrated circuit layer and the multilayer wiring structure and between wiring layers of the multilayer wiring structure. Also, an uppermost wiring layer of the multilayer wiring structure may be directly or indirectly connected to the first barrier metal layer 115-1 through a vertical contact which may penetrate the first insulating layer 120-1 and thus may be electrically connected to the first Cu pad 110-1. Descriptions about the integrated circuit layer and the multilayer wiring structure may be further provided with reference to FIGS. 4 through 5H.

Portions of the first Cu pad 110-1 may be buried in the first insulating layer 120-1. Other portions of the first Cu pad 110-1 may protrude from an upper surface S1 of the first insulating layer 120-1. As shown in FIG. 1, a lower surface and sides of the first Cu pad 110-1 may be covered by the first barrier metal layer 115-1.

The first Cu pad 110-1 may be formed by, for example, plating and/or physical vapor deposition (PVD). For example, when the first Cu pad 110-1 is formed by plating, a seed layer may be formed by sputtering and/or deposition, and a Cu layer may be formed by plating by using the formed seed layer. The Cu layer may be planarized through chemical mechanical polishing (CMP), forming the first Cu pad 110-1. The first Cu pad 110-1 may have, for example, a cylindrical shape, but a shape of the first Cu pad 110-1 is not limited thereto. For example, the first Cu pad 110-1 may have various shapes such as cylindroid and/or polyprism. A size of the first Cu pad 110-1 may vary. For example, the first Cu pad 110-1 may have a width in a range from about 1 µm to about 20 µm. The first Cu pad 110-1 may protrude from the upper surface S1 of the first insulating layer 120-1, and a height of a protrusion of the first Cu pad 110-1 may be from about 15% to about 50% of the width of the first Cu pad 110-1. As the width of the first Cu pad 110-1 increases, a ratio of the height of the protrusion of the first Cu pad 110-1 to the width of the first Cu pad 110-1 may decrease. For example, if the width of the first Cu pad 110-1 is about 1 µm, the height of the protrusion may be about 0.5 µm. If the width of the first Cu pad 110-1 is about 20 µm, the height of the protrusion may be about 3 µm to about 5 µm. However, the width and the height of the protrusion of the first Cu pad 110-1 are not limited thereto.

The first barrier metal layer 115-1 may cover the lower surface and the sides of the first Cu pad 110-1. The first barrier metal layer 115-1 may have a structure corresponding to the structure of the first Cu pad 110-1. For example, a lower portion of the first barrier metal layer 115-1 may be buried in the first insulating layer 120-1 and an upper portion thereof may protrude from the upper surface S1 of the first insulating layer 120-1. The first barrier metal layer 115-1 may reduce or prevent Cu diffusion and may have a single-layer structure formed, for example, of one material selected from the group consisting of titanium (Ti), tantalum (Ta), titanium nitride (TiN), and tantalum nitride (TaN) or may have a stack structure in which, for example, at least two materials selected from the group consisting of Ti, Ta, TiN, and TaN are stacked. However, materials of the first barrier metal layer 115-1 are not limited thereto.

The first barrier metal layer 115-1 formed on the sides of the first Cu pad 110-1 may have a height the same as a height of the first Cu pad 110-1. For example, the first barrier metal layer 115-1 and the first Cu pad 110-1 may be planarized by CMP to form an upper surface S2 of the first Cu pad 110-1 on the same level as an upper surface S3 of the first barrier metal layer 115-1 formed on the sides of the first Cu pad 110-1.

The first polymer layer 130-1 may be formed on the first insulating layer 120-1 and may cover portions of sides of the first barrier metal layer 115-1. In particular, the first polymer layer 130-1 may cover portions of the sides of the first barrier metal layer 115-1 that protrude from the upper surface S1 of the first insulating layer 120-1. Also, an upper surface S4 of the first polymer layer 130-1 may be on the same level as the upper surface S2 of the first Cu pad 110-1 and the upper surface S3 of the first barrier metal layer 115-1.

The first polymer layer 130-1 may be formed of polymers being relatively resistant to heat and having a high bonding force. For example, the first polymer layer 130-1 may be formed of polymers that may endure thermal treatment in a range from about 180° C. to about 300° C. The first polymer layer 130-1 may be formed of a material of which reflow may be easily performed by the thermal treatment and which may be easily bonded to another polymer, for example, a second polymer layer 130-2 of the second wafer 100-2, through the thermal treatment. Furthermore, the first polymer layer 130-1 may be formed of a material which may be hardened through the thermal treatment and which may maintain a strong bonding force through the hardening.

The first polymer layer 130-1 may be formed of a material which may be etched by a developer to some extent. Accordingly, after the first polymer layer 130-1 is formed, portions of the upper surface of the first polymer layer 130-1 may be easily removed by a developing process instead of by photolithography. For example, although photolithography may not be performed, portions of the upper surface of the first polymer layer 130-1 may be removed by a developer such as tetramethyl ammonium hydroxide (TMAH) by adding a sufficient amount of ortho-cresol components to the first polymer layer 130-1. Also, a thickness of the first polymer layer 130-1 that may be removed through the developing process may be adjusted by adjusting the amount of components such as meta-cresol and/or ortho-cresol which may be added to the first polymer layer 130-1.

The first polymer layer 130-1 may be formed of, for example, at least one material selected from the group consisting of polyimide, polyamide, polyacrylate, and polyaramide. Materials of the first polymer layer 130-1 are not limited thereto. For example, the first polymer layer 130-1 may be formed of another type of polymer which may have the above-described characteristics such as heat resistance, reflow capability, high bonding force through hardening, and removal of portions of the first polymer layer 130-1 through a developing process.

The second wafer 100-2 may include a second insulating layer 120-2, a second Cu pad 110-2, a second barrier metal layer 115-2, and the second polymer layer 130-2, which may be similar to the corresponding elements of the first wafer 100-1. The second polymer layer 130-2 may be separate from the second wafer 100-2. Structures, materials, etc. of the second insulating layer 120-2, the second Cu pad 110-2, the second barrier metal layer 115-2, and the second polymer layer 130-2 may be similar to the corresponding first insulating layer 120-1, first Cu pad 110-1, first barrier metal layer 115-1, and first polymer layer 130-1 of the first wafer 100-1, and thus, descriptions thereof may be omitted.

In some embodiments, the wafer-to-wafer bonding structure 1000 may have a structure in which the first wafer 100-1 and the second wafer 100-2 are bonded to each other through bonding of the first Cu pad 110-1 and the second Cu pad 110-2 and bonding of the first polymer layer 130-1 and the second polymer layer 130-2. More particularly, the upper surface of the first Cu pad 110-1 may be bonded to that of the second Cu pad 110-2 through the thermal treatment and the upper surface of the first polymer layer 130-1 may be bonded to that of the second polymer layer 130-2 through the thermal treatment. The thermal treatment may be performed at a temperature at which the first Cu pad 110-1 and the second Cu pad 110-2 are bonded and thus coupled. For example, a temperature of the thermal treatment may be from about 180° C. to about 300° C.

The first polymer layer 130-1 and the second polymer layer 130-2 may be formed of a material which may endure the temperature of the thermal treatment. Also, the first polymer layer 130-1 and the second polymer layer 130-2 may have flowability through reflow at the above temperature of the thermal treatment, and thus gaps and/or voids may be filled. Furthermore, since the first polymer layer 130-1 and the second polymer layer 130-2 may maintain a strong bonding force through hardening which is performed through the thermal treatment, bonding defects, which occur when conventional dummy patterns are bonded and/or TEOS oxide layers are bonded, may be reduced or eliminated.

The first polymer layer 130-1 and the second polymer layer 130-2 may be hardened by the thermal treatment and may have a hardness of 90% or above. The hardening may result from crystallization of the polymers at or above a glass transition temperature (Tg). More than 90% of the polymers may be crystallized at the Tg, which may result in a strong bond between the first polymer layer 130-1 and the second polymer layer 130-2.

In FIG. 1, the first Cu pad 110-1 and the second Cu pad 110-2, the first barrier metal layer 115-1 and the second barrier metal layer 115-2, and the first polymer layer 130-1 and the second polymer layer 130-2 are separated by an alternating long and short dash line for convenience to show that the first Cu pad 110-1, the first barrier metal layer 115-1, and the first polymer layer 130-1 are based on the first wafer 100-1, and the second Cu pad 110-2, the second barrier metal layer 115-2, and the second polymer layer 130-2 are based on the second wafer 100-2. Therefore, the first Cu pad 110-1 and the second Cu pad 110-2 may be bonded to each other to form a Cu pad 110, and the first barrier metal layer 115-1 and the second barrier metal layer 115-2 may be bonded to each other to form a barrier metal layer 115. In addition, the first polymer layer 130-1 and the second polymer layer 130-2 may be bonded to each other to form a polymer layer 130.

The wafer-to-wafer bonding structure 1000 may have a structure in which two wafers are bonded by bonding Cu pads to each other and polymer layers to each other, and thus it may be unnecessary to additionally form dummy patterns. Accordingly, bonding defects, which may occur in the dummy patterns, may be reduced or eliminated. Also, while the polymer layers are bonded through the thermal treatment, gaps and/or voids may be filled through a reflow of the polymer layers, which may reduce or eliminate defects regarding the gaps and/or voids. Since the polymer layers that may have a hardness of 90% or above may be bonded to each other, the bonding force of the wafers, which may be very strong, may be maintained.

Figure 2A:
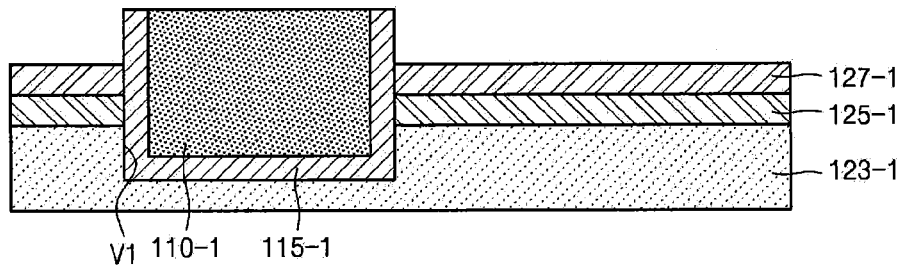
FIGS. 2A through 2C are schematic cross-sectional views illustrating intermediate process operations in methods for fabricating the wafer-to-wafer bonding structure of FIG. 1 according to some embodiments of the inventive concepts.
Figure 2B:
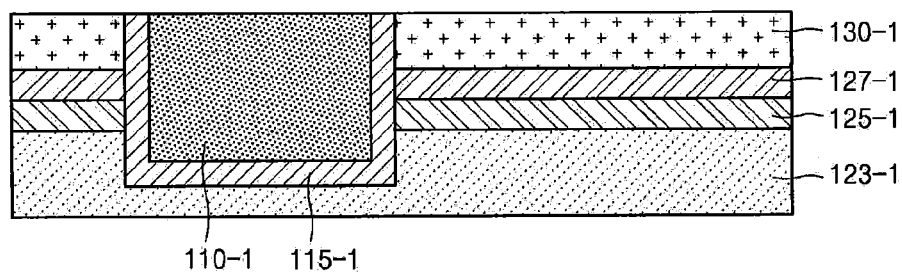
Figure 2C:
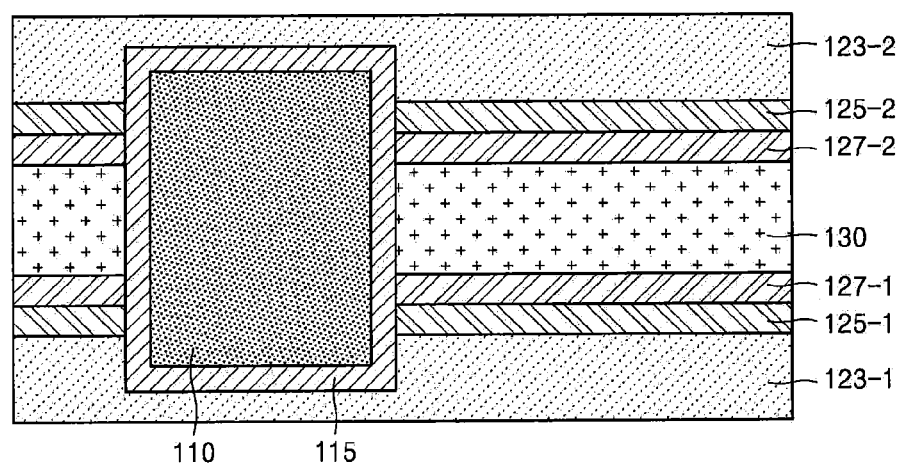
Figure 3:
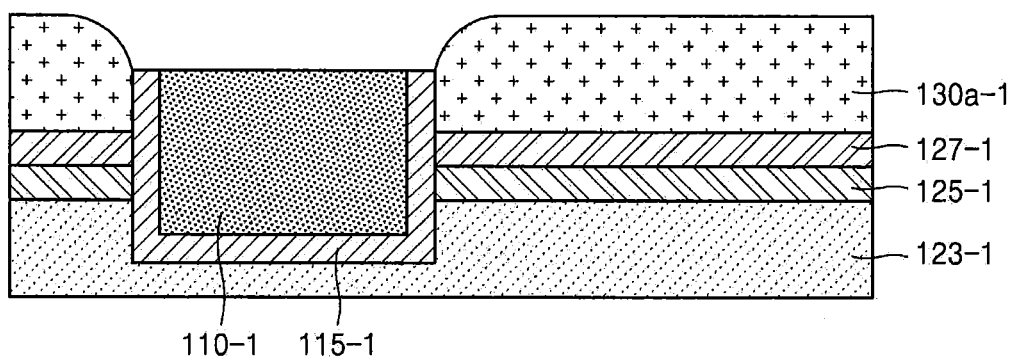
FIG. 3 is a cross-sectional view illustrating a modified example of FIG. 2B according to some embodiments of the inventive concepts.

FIGS. 2A through 2C are schematic cross-sectional views illustrating intermediate process operations in methods for fabricating the wafer-to-wafer bonding structure 1000 of FIG. 1 according to some embodiments of the inventive concepts, and FIG. 3 is a cross-sectional view illustrating a modified example of FIG. 2B, according to some embodiments of the inventive concepts.

Referring to FIG. 2A, an intermediate insulating layer 125-1 and an upper insulating layer 127-1 may be sequentially formed on a lower insulating layer 123-1. The lower insulating layer 123-1, the intermediate insulating layer 125-1, and the upper insulating layer 127-1 may be included in the first insulating layer 120-1 and/or the second insulating layer 120-2 of FIG. 1. For example, the lower insulating layer 123-1 may be formed as a TEOS layer, the intermediate insulating layer 125-1 may be formed as an SiCN layer, and the upper insulating layer 127-1 may be formed as a TEOS layer.

A via V1 may be formed through the upper insulating layer 127-1 and the intermediate insulating layer 125-1 and may have a groove in a portion of an upper surface of the lower insulating layer 123-1. A barrier metal layer 115-1 and a Cu pad 110-1 may be formed in the via V1. A portion of the upper surface of the upper insulating layer 127-1 may be removed by etching and, thus, portions of upper surfaces of the barrier metal layer 115-1 and the Cu pad 110-1 may protrude from the upper surface of the upper insulating layer 127-1. In some embodiments, the upper insulating layer 127-1 may be totally removed and portions of upper surfaces of the barrier metal layer 115-1 and the Cu pad 110-1 may protrude from an upper surface of the intermediate insulating layer 125-1. In some embodiments, the barrier metal layer 115-1 may be electrically connected to a lower multilayer wiring structure through a vertical contact or may be electrically connected to the lower multilayer wiring structure directly.

Referring to FIG. 2B, a polymer material layer may be formed on the upper insulating layer 127-1 to cover the protruding barrier metal layer 115-1 and the Cu pad 110-1. The polymer material layer may be formed of, for example, polymers having characteristics described with reference to FIG. 1. For example, in some embodiments, the polymer material layer may be formed of at least one material selected from the group consisting of polyimide, polyamide, polyacrylate, and polyaramide.

A polymer layer 130-1 may be formed by developing the polymer material layer through a developer and removing portions of an upper surface of the polymer material layer to a predetermined thickness. After the polymer layer 130-1 is formed, the upper surfaces of the barrier metal layer 115-1 and the Cu pad 110-1 may be exposed. For example, the upper surface of the polymer layer 130-1 may be on the same level as the upper surfaces of the barrier metal layer 115-1 and the Cu pad 110-1. If the polymer layer 130-1 is formed to a height which is the same as a protruding height of the Cu pad 110-1 by exactly adjusting a thickness of the polymer layer 130-1, the developing process may not be performed.

If a width of the Cu pad 110-1 is about 1 μm and the protruding height is about 0.5 μm, the polymer material layer may be formed to about 1 μm or more through spin coating, and thickness uniformity may be controlled to about 3% (300 Å) or less. When a polymer material layer having a low viscosity is coated, the polymer material layer may be coated to about 1000 Å. Also, if the width of the Cu pad 110-1 is about 20 μm and the protruding height is about 3 μm to about 5 μm, when the polymer material layer is coated to a thickness of about 6 μm to about 10 μm, thickness uniformity, which may be about 3% (300 Å) or less, may be controlled.

In some embodiments, portions of the upper surface of the polymer material layer may be removed not to expose the upper surfaces of the barrier metal layer 115-1 and the Cu pad 110-1 during the developing process. Subsequent exposing and developing processes may be further performed and the polymer material layer may be removed only from the upper surfaces of the barrier metal layer 115-1 and the Cu pad 110-1. Accordingly, a height of the upper surface of the polymer material layer may be greater than that of the upper surfaces of the barrier metal layer 115-1 and the Cu pad 110-1.

FIG. 3 illustrates embodiments where the developing process is performed on an entire surface of the polymer material layer and then the subsequent exposing and developing processes are performed to form a polymer layer 130a-1. During the subsequent developing process, a side portion of the polymer layer 130a-1 that is adjacent to the upper surfaces of the barrier metal layer 115-1 and the Cu pad 110-1 may have a gently curved structure, not a vertical structure, due to the flowability of the polymer layer 130a-1.

The structure shown in FIG. 3 may be formed by performing the exposing and developing processes without performing a first developing process. That is, although the first developing process may not be performed, if the exposing process is performed and then the developing process is performed, portions irradiated with light may be totally removed from the polymer material layer and portions that are not irradiated with light may be at least partially removed through the developing process. Thus, the structure shown in FIG. 3 may be formed.

Referring to FIG. 2C, two wafers having the structure shown in FIG. 2B may be bonded to each other through a thermal treatment so that Cu pads face each other. A temperature of the thermal treatment may be, for example, in a range from about 180° C. to about 300° C. The Cu pads, the barrier metal layers, and the polymer layers may be bonded through the thermal treatment, and the Cu pad 110, the barrier metal layer 115, and the polymer layer 130 may be formed.

A flowability of the polymer layer 130 through reflow at the temperature of the thermal treatment may cause gaps and/or voids in a surface of the polymer layer 130 to be filled. In addition, a hardness of 90% or above of the polymer layer 130 due to the thermal treatment may provide a strong bonding force and, thus, the wafers may remain strongly bonded to each other.

Some polymers which are used to bond wafers to each other in a package level may not be resistant to heat. For example, a bonding process at the package level may be performed at a low temperature ranging from about 180° C. to about 200° C., and accordingly, polymers such as epoxy, for example, an epoxy molding compound (EMC), and polystyrene may be used. If the temperature is equal to or greater than 200° C., these polymers may be burned and, thus, these polymers may not function as a bonding medium. Therefore, these polymers may not be used for Cu pads which are bonded through a thermal treatment at a wafer level as described in the present application.

Figure 4:
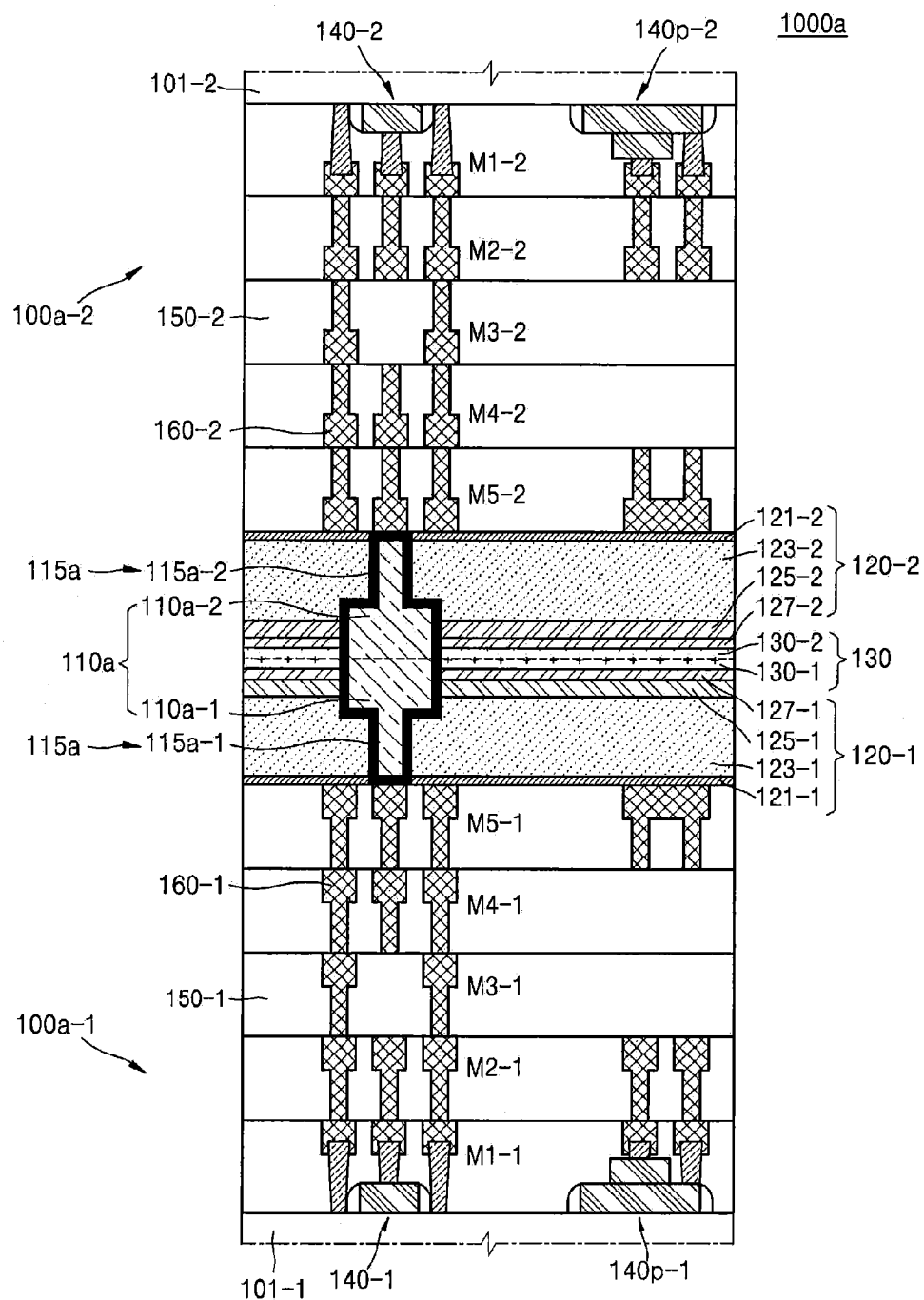
FIG. 4 is a cross-sectional view illustrating a wafer-to-wafer bonding structure according to some embodiments of the inventive concepts.

FIG. 4 is a cross-sectional view illustrating a wafer-to-wafer bonding structure 1000a according to some embodiments of the inventive concepts. For convenience, descriptions that are also provided with reference to FIGS. 1 through 3 may be briefly provided and/or omitted.

FIG. 4 illustrates a multilayer wiring structure and an integrated circuit structure formed on lower surfaces of first and second insulating layers 120-1 and 120-2 of the wafer-to-wafer bonding structure 1000a in detail. Structures of a barrier metal layer 115a and a Cu pad 110a may be different from those of the barrier metal layer 115 and the Cu pad 110 of the wafer-to-wafer bonding structure 1000 of FIG. 1. Hereinafter, a first wafer 100a-1 disposed on a lower portion of the wafer-to-wafer bonding structure 1000a will be mainly described.

The first wafer 100a may include a first substrate 101-1, first integrated circuit layers 140-1 and 140p-1, a first interlayer insulating layer 150-1, a first multilayer wiring structure 160-1, the first insulating layer 120-1, a first polymer layer 130-1, a first barrier metal layer 115a-1, and a first Cu pad 110a-1.

The first substrate 101-1 may be formed based on a group IV material wafer such as a silicon wafer, or a group compound wafer. Also, the first substrate 101-1 may be formed as a monocrystalline wafer such as silicon monocrystalline wafer in consideration of a formation method. However, the first substrate 101-1 is not limited to a monocrystalline wafer, and various wafers such as an epitaxial wafer, a polished wafer, a thermal treated (annealed) wafer, and a silicon-on-insulator (SOI) wafer may be used as the first substrate 101-1. The epitaxial wafer may be, for example, a wafer in which crystalline materials grow on a monocrystalline silicon substrate. The first substrate 101-1 may include wells and/or structures doped with impurities. Also, the first substrate 101-1 may include various device separation structures such as a shallow trench isolation (STI) structure.

The first integrated circuit layers 140-1 and 140p-1 may be formed on the first substrate 101-1 and may include various semiconductor devices such as transistors, diodes, resistors, and/or capacitors. FIG. 4 illustrates a transistor which represents an integrated circuit. The transistor may include, for example, source/drain areas, a channel area formed in the substrate, and a gate structure formed on the substrate. For example, in some embodiments, a transistor included in the first integrated circuit layer 140-1 may be a transistor used in a memory device such as dynamic random access memory (DRAM), and a transistor included in the first integrated circuit layer 140p-1 may be a transistor used in a logic device and/or a peripheral (peri) area. However, embodiments of the inventive concepts are not limited thereto.

The first integrated circuit layers 140-1 and 140p-1 may exchange electrical signals with an external device through the first multilayer wiring structure 160-1. An electrical signal may include a power voltage, a ground voltage, a signal voltage, etc. The first multilayer wiring structure 160-1 may include five wiring layers M1-1 to M5-1. However, the number of wiring layers is not limited to five. For example, the number of wiring layers of the first multilayer wiring structure 160-1 may be less than five or greater than five.

The first interlayer insulating layer 150-1 may be formed on the first substrate 101-1 and may cover the first integrated circuit layers 140-1 and 140p-1 and the first multilayer wiring structure 160-1. The first interlayer insulating layer 150-1 may be multiple layers corresponding to the number of wiring layers of the first multilayer wiring structure 160-1. When the first interlayer insulating layer 150-1 is multiple layers, the multiple layers of the first interlayer insulating layer 150-1 may each be composed of the same material or the multiple layers may be composed of at least two different materials. In the first interlayer insulating layer 150-1 as illustrated in FIG. 4, one or more portions of the first multilayer wiring structure 160-1 appear cut, but as FIG. 4 illustrates only a cross-sectional view, these portions may be connected to other wiring layers in other areas in a direction perpendicular to cross-sectional view.

The first insulating layer 120-1 may be formed on the first interlayer insulating layer 150-1 and the first multilayer wiring structure 160-1. In some embodiments, the first insulating layer 120-1 may include a lowermost insulating layer 121-1, a lower insulating layer 123-1, an intermediate insulating layer 125-1, and an upper insulating layer 127-1.

The lower insulating layer 123-1, the intermediate insulating layer 125-1, and the upper insulating layer 127-1 may respectively correspond to the lower insulating layer 123-1, the intermediate insulating layer 125-1, and the upper insulating layer 127-1 in FIG. 2a. Accordingly, the lower insulating layer 123-1 may be formed as a TEOS layer, the intermediate insulating layer 125-1 may be formed as an SiCN layer, and the upper insulating layer 127-1 may be formed as a TEOS layer. However, materials of the lower insulating layer 123-1, the intermediate insulating layer 125-1, and the upper insulating layer 127-1 are not limited thereto.

The lowermost insulating layer 121-1 may be formed as an SiCN layer and may prevent ions from diffusing. Also, the lowermost insulating layer 121-1 may function as a stop layer during an etching process of the lower insulating layer 123-1. In some embodiments, one or more of the lowermost insulating layer 121-1 and the intermediate insulating layer 125-1 may be formed as a silicon dioxide (SiO2) layer instead of a SiCN layer.

The first polymer layer 130-1 may be the same as the first polymer layer 130-1 of FIG. 1 and/or the polymer layers 130-1 and 130a-1 of FIGS. 2B through 3. Therefore, detailed descriptions about the first polymer layer 130-1 may be omitted.

As shown in FIG. 4, the first Cu pad 110a-1 may have a structure in which a width of a lower portion thereof may be small and a width of an upper portion thereof may be large. The structure of the first Cu pad 110a-1 may be formed by a dual damascene process. The dual damascene process may be a well-known process, and thus detailed description thereof may be omitted. Since the width of the upper portion of the first Cu pad 110a-1 may be large, contact resistance of Cu pads while bonded may be decreased. Also, since the Cu pads may be bonded in a wide area, the Cu pads may maintain a strong bond to each other. The first Cu pad 110a-1 of FIG. 4 may be substantially the same as the first Cu pad 110-1 and/or the Cu pad 110-1 of FIGS. 1 through 3 except for the structure thereof.

The first barrier metal layer 115a-1 may have a structure in which a lower surface and sides of the first Cu pad 110a-1 may be covered. As the first Cu pad 110a-1 has a structure in which the width of the lower portion thereof may be small and that of the upper portion thereof may be large, the first barrier metal layer 115a-1 may have a structure in which a gap of a lower portion thereof may be small and that of an upper portion thereof may be large in accordance with the structure of the first Cu pad 110a-1. The first barrier metal layer 115a-1 of FIG. 4 may be substantially the same as the first barrier metal layer 115-1 and/or the barrier metal layer 115-1 of FIGS. 1 through 3 except for the structure thereof.

Based on characteristics of the structures, lower portions of the first Cu pad 110a-1 and the first barrier metal layer 115a-1 may be connected to an uppermost wiring layer M5-1 of the first multilayer wiring structure 160-1. For example, as narrow portions of the first Cu pad 110a-1 and the first barrier metal layer 115a-1 may penetrate the first insulating layer 120-1, the lower portion of the first barrier metal layer 115a-1 may contact an upper surface of the uppermost wiring layer M5-1. Accordingly, the first Cu pad 110a-1 may be electrically connected to the first multilayer wiring structure 160-1 through the first barrier metal layer 115a-1.

A structure of a second wafer 100a-2 may be the same as or similar to the above-described structure of the first wafer 100a-1. Therefore, detailed descriptions of the second wafer 100a-2 may be omitted. As described with reference to FIG. 1, the classification of the first Cu pad 110a-1 and a second Cu pad 110a-2, the first barrier metal layer 115a-1 and the second barrier metal layer 115a-2, and the first polymer layer 130-1 and the second polymer layer 130-2 may be made for convenience of explanation and for ease of understanding. Therefore, the first Cu pad 110a-1 and the second Cu pad 110a-2 may form the Cu pad 110a, the first barrier metal layer 115a-1 and the second barrier metal layer 115a-2 may form the barrier metal layer 115a, and the first polymer layer 130-1 and the second polymer layer 130-2 may form the polymer layer 130, which may be inseparably bonded.

FIGS. 5A through 5H are cross-sectional views illustrating intermediate process operations in methods for fabricating the wafer-to-wafer bonding structure 1000a of FIG. 4, according to some embodiments of the inventive concepts. Descriptions that are also provided with reference to FIGS. 1 through 4 may be briefly provided and/or omitted for convenience.

Figure 5A:
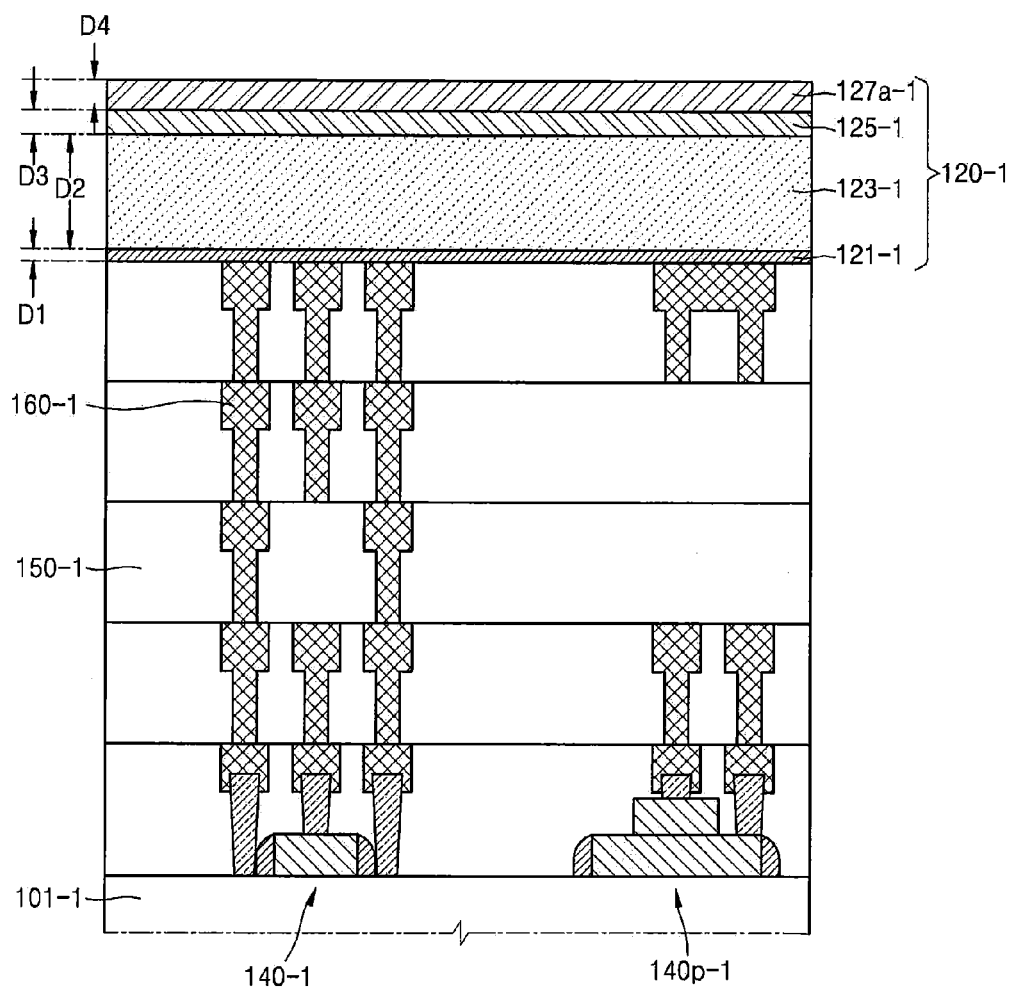
FIGS. 5A through 5H are cross-sectional views illustrating intermediate process operations in methods for fabricating the wafer-to-wafer bonding structure of FIG. 4 according to some embodiments of the inventive concepts.

Referring to FIG. 5A, the first integrated circuit layers 140-1 and 140p-1, the first interlayer insulating layer 150-1, and the first multilayer wiring structure 160-1 may be formed on the first substrate 101-1. The first insulating layer 120-1 may be formed on the first interlayer insulating layer 150-1 and the first multilayer wiring structure 160-1.

The first insulating layer 120-1 may be formed by sequentially stacking the lowermost insulating layer 121-1, the lower insulating layer 123-1, the intermediate insulating layer 125-1, and the upper insulating layer 127a-1 on the first interlayer insulating layer 150-1 and the first multilayer wiring structure 160-1. For example, in some embodiments, the lowermost insulating layer 121-1 may be formed as a SiCN layer, the lower insulating layer 123-1 may be formed as a TEOS layer, the intermediate insulating layer 125-1 may be formed as a SiCN layer, and the upper insulating layer 127a-1 may be formed as a TEOS layer. In some embodiments, one or more of the lowermost insulating layer 121-1 and the intermediate insulating layer 125-1 may be formed as a SiO2 layer. However, materials of the lowermost insulating layer 121-1, the lower insulating layer 123-1, the intermediate insulating layer 125-1, and the upper insulating layer 127a-1 are provided as examples and are not limited thereto.

In some embodiments, a first thickness D1 of the lowermost insulating layer 121-1 may be about 75 Å. A second thickness D2 of the lower insulating layer 123-1 may be about 4500 Å. A third thickness D3 of the intermediate insulating layer 125-1 may be about 1000 Å. A fourth thickness D4 of the upper insulating layer 127a-1 may be about 1250 Å. However, the thicknesses of the lowermost insulating layer 121-1, the lower insulating layer 123-1, the intermediate insulating layer 125-1, and the upper insulating layer 127a-1 are provided as example and are not limited thereto.

Figure 5B:
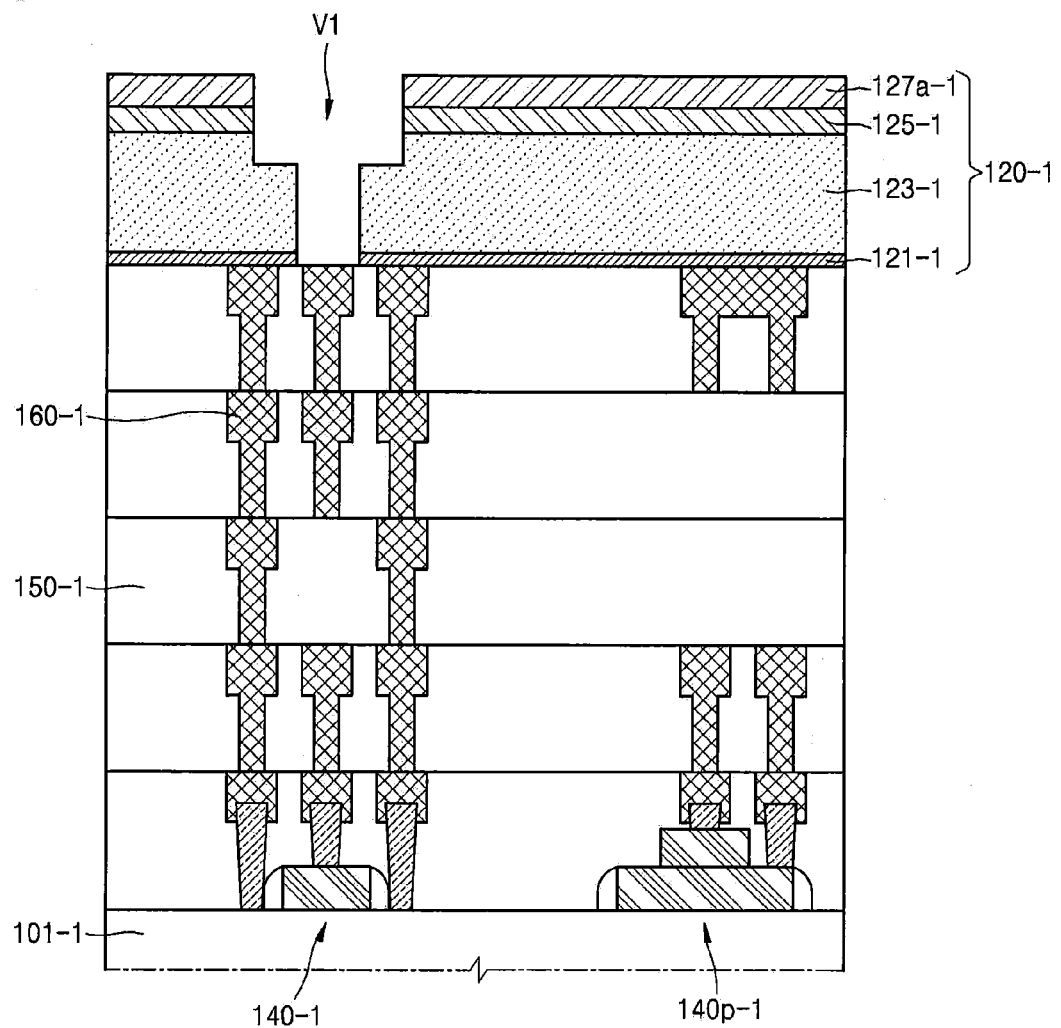

Referring to FIG. 5B, a via V1 may be formed through the first insulating layer 120-1. The via V1 may expose an upper surface of the uppermost wiring layer M5-1 of FIG. 4 of the first multilayer wiring structure 160-1. The via V1 may have a structure of a dual damascene pattern. The dual damascene pattern may be a pattern in which a lower portion thereof may be small and an upper portion thereof may be large and may be frequently used in a dual damascene process. The dual damascene pattern may be formed by performing an etching process twice. For example, a photoresist (PR) pattern having a relatively small space may be used to form a first via having a relatively small width, and then a material layer filling the first via may be formed. A second via having a relatively large width may be formed by using a PR pattern having a relatively large space, and thus a dual damascene pattern may be formed.

Figure 5C:
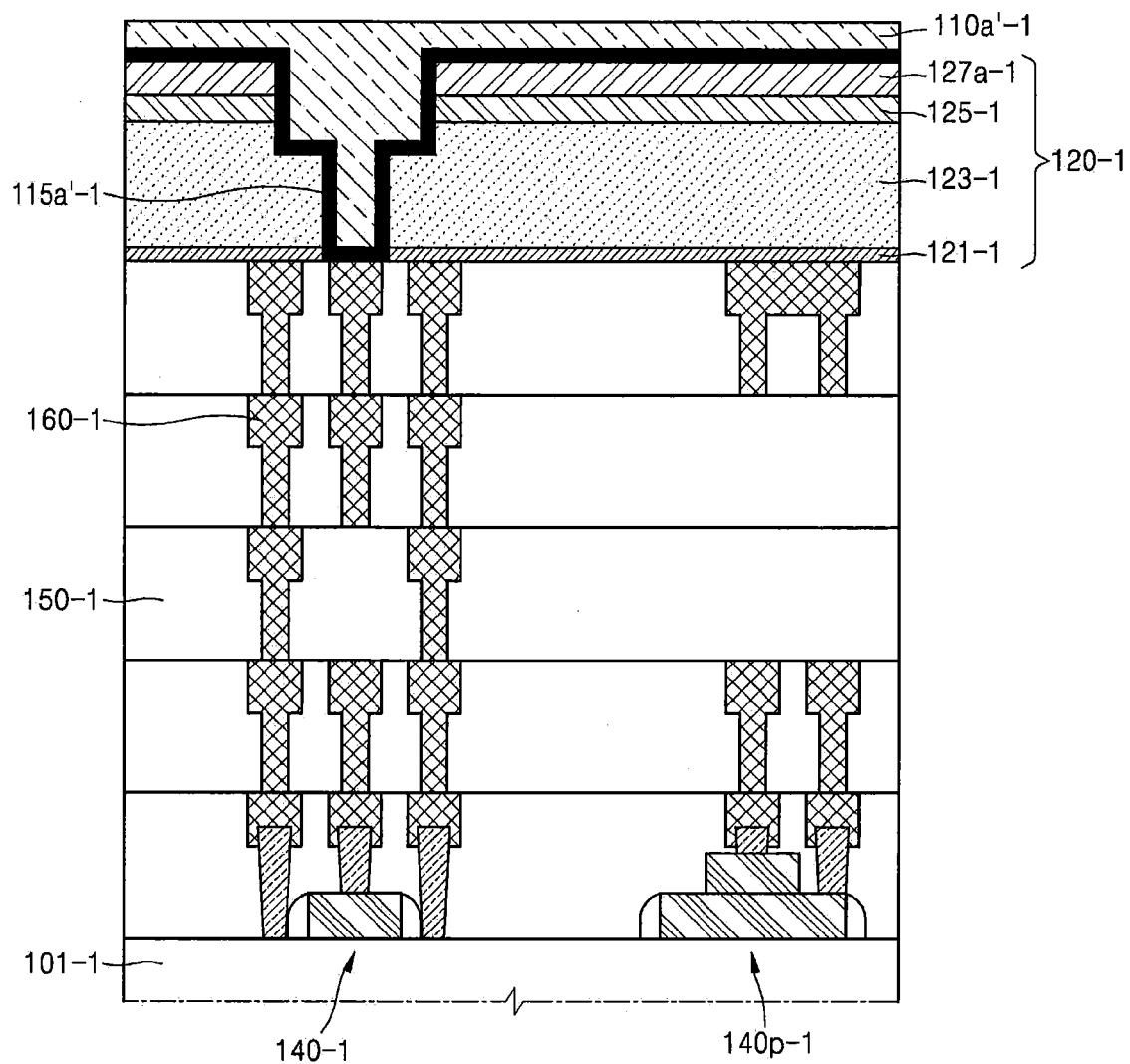

Referring to FIG. 5C, a first barrier metal layer 115a'-1 and a first Cu layer 110a'-1 may be formed inside the via V1 and on the upper insulating layer 127a-1. For example, the first barrier metal layer 115a'-1 may be formed, for example, by physical vapor deposition (PVD), chemical vapor deposition (CVD), and/or plating. In the case of plating, a seed layer may be used. The first barrier metal layer 115a'-1 may have a single-layer structure formed of, for example, one material selected from the group consisting of Ti, Ta, TiN, and TaN or may have a stack structure in which, for example, at least two materials selected from the group consisting of Ti, Ta, TiN, and Tan are stacked. The first Cu layer 110a'-1 may be formed, for example, by PVD and/or plating. In the case of plating, a seed layer may be used. In some embodiments, the first barrier metal layer 115a'-1 may be used as a seed layer, and thus, a separate seed layer may not be formed.

Figure 5D:
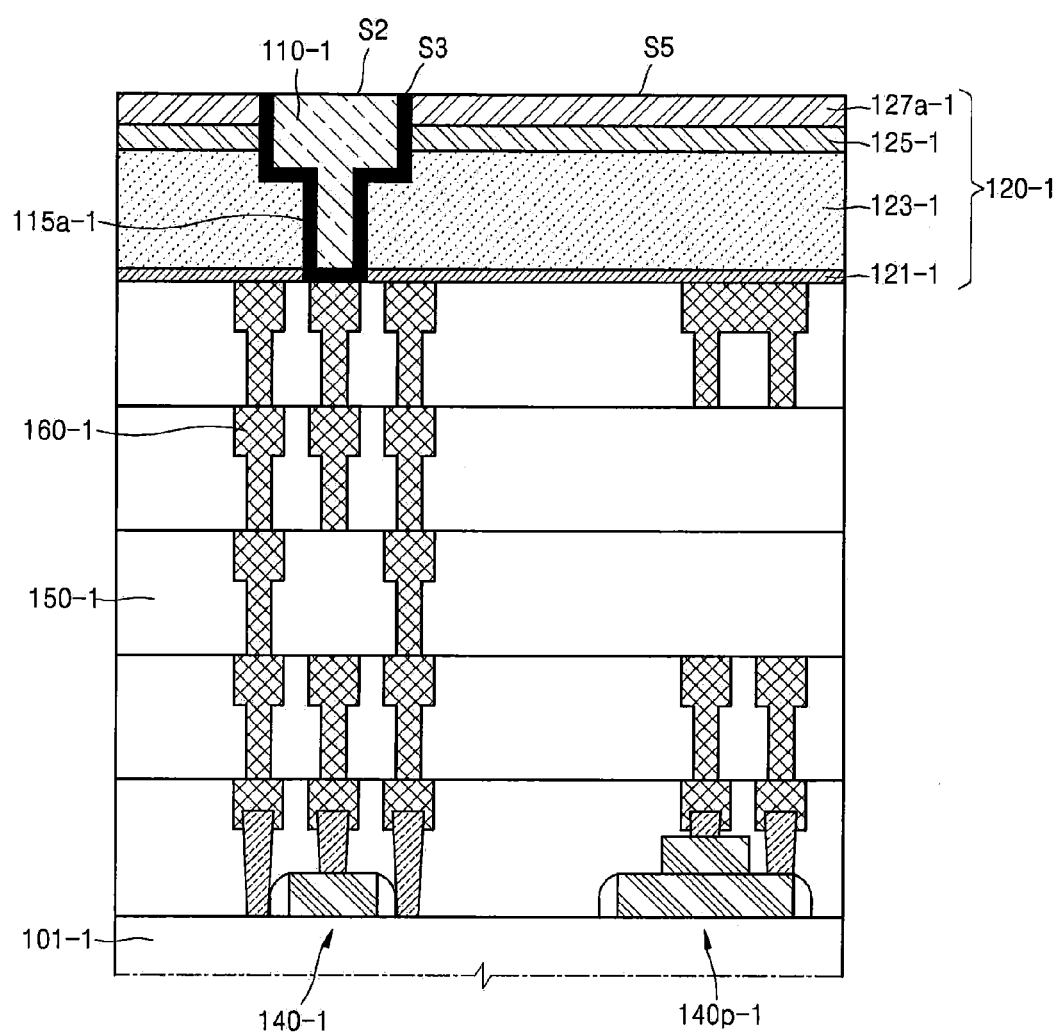

Referring to FIG. 5D, the first barrier metal layer 115a'-1 and the first Cu layer 110a'-1 may be planarized by CMP until the upper insulating layer 127a-1 is exposed, forming the first barrier metal layer 115a-1 and the first Cu pad 110a-1 inside the via V1. Also, through the CMP, the upper surface S3 of the first barrier metal layer 115a-1 and the upper surface S2 of the first Cu pad 110a-1 may be on the same level as the upper layer S5 of the upper insulating layer 127a-1.

In some embodiments, portions of the upper surface of the upper insulating layer 127a-1 may be removed by CMP, and thus a thickness of the upper insulating layer 127a-1 may decrease. When the thickness of the upper insulating layer 127a-1 is decreased during CMP, the level of the upper surface S3 of the first barrier metal layer 115a-1 and the upper surface S2 of the first Cu pad 110a-1 may also be decreased.

Figure 5E:
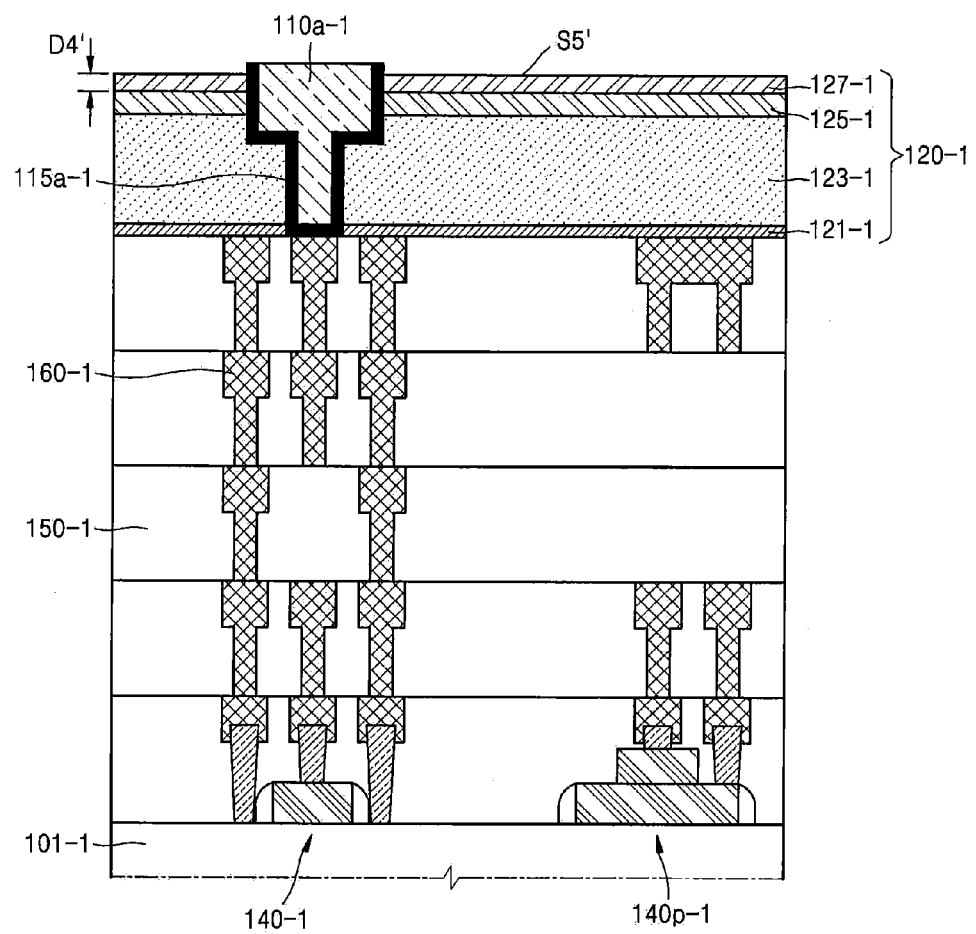

Referring to FIG. 5E, portions of the upper surface of the upper insulating layer 127a-1 may be removed by performing an etching process, for example, an isotropic etching process. After the etching process, a fourth thickness D4' of the upper insulating layer 127-1 may be about 800 Å. For example, as shown in FIG. 5A, in some embodiments, when a thickness of the upper insulating layer 127a-1 is about 1250 Å, a thickness of a portion that may be removed by performing the etching process may be about 450 Å. However, the fourth thickness D4' and the thickness of the removed portion are not limited thereto. For example, in some embodiments, the upper insulating layer 127a-1 may be totally removed by performing the etching process and the upper surface of the intermediate insulating layer 125-1 may be exposed.

After the etching process of the upper insulating layer 127a-1, the first barrier metal layer 115a-1 and the first Cu pad 110a-1 may protrude from an upper layer S5' of the upper insulating layer 127-1. As described above, in some embodiments, the thickness of the removed portion of the upper insulating layer 127-1 may be about 450 Å, and therefore heights of protruding portions of the first barrier metal layer 115a-1 and the first Cu pad 110a-1 may also be about 450 Å.

Figure 5F:
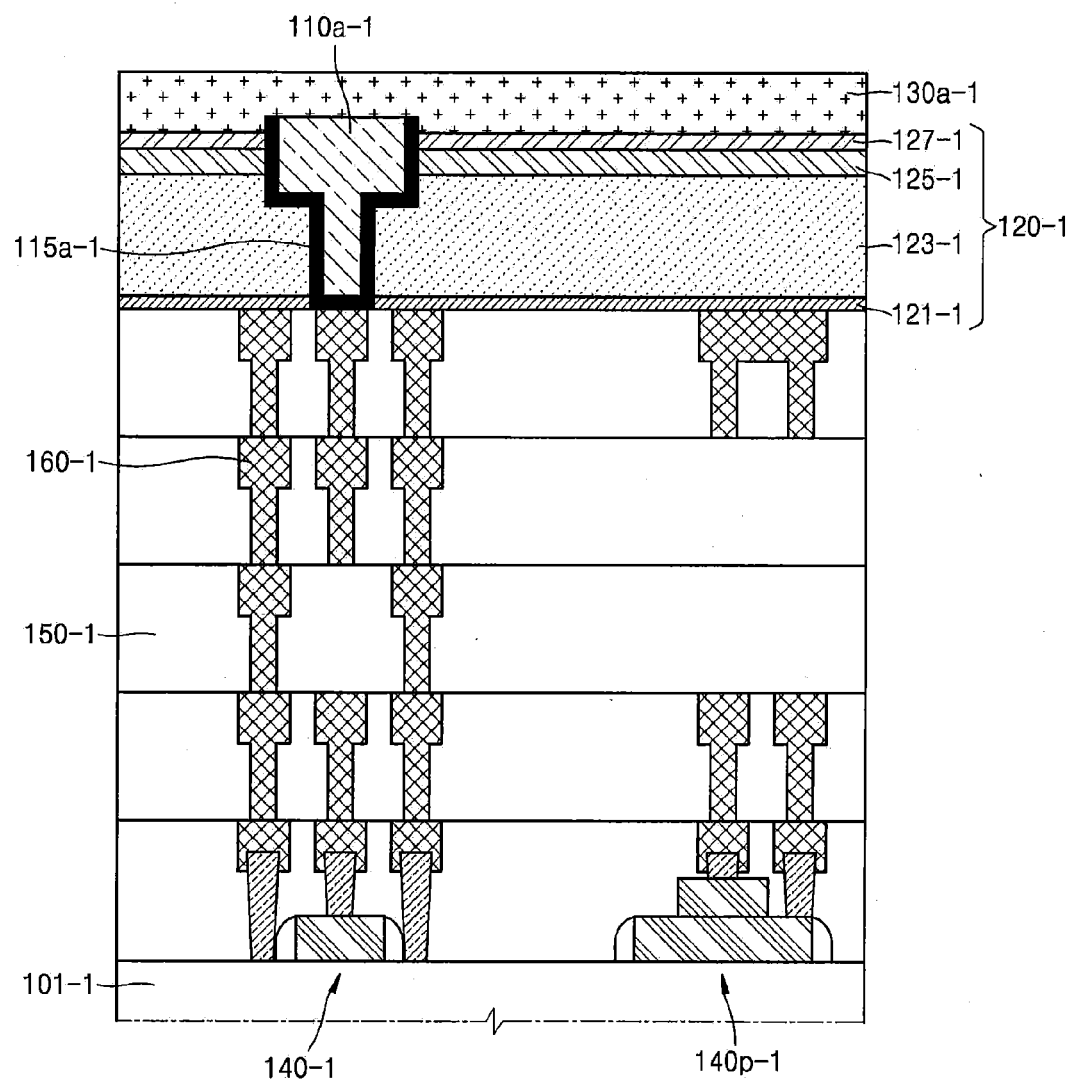

Referring to FIG. 5F, a first polymer material layer 130a-1 may be formed to cover the first barrier metal layer 115a-1 and the first Cu pad 110a-1. The first polymer material layer 130a-1 may have a proper thickness in consideration of a thickness of a portion to be removed by performing a developing process. Also, the amount of a material, for example, ortho-cresol, may be properly adjusted in consideration of a ratio and/or an amount of a portion of the first polymer material layer 130a-1 to be removed by performing the developing process.

Materials, characteristics, etc. of the first polymer material layer 130a-1 may be the same as those provided with reference to FIGS. 1 through 3.

Figure 5G:
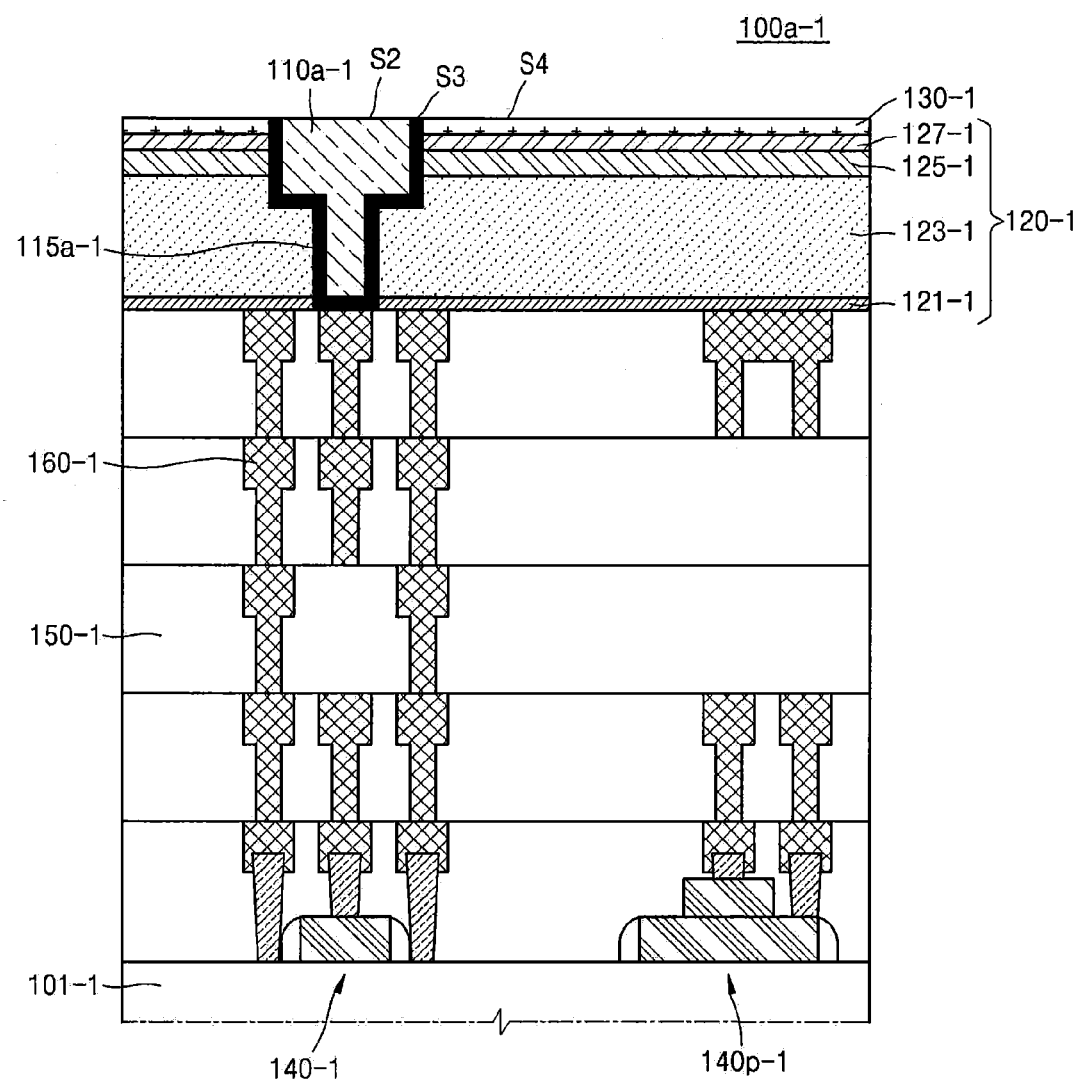

Referring to FIG. 5G, an upper portion of the first polymer material layer 130a-1 may be removed to a predetermined thickness through the developing process to form the first polymer layer 130-1. The upper surface S3 of the first barrier metal layer 115a-1 and the upper surface S2 of the first Cu pad 110a-1 may be re-exposed by forming the first polymer layer 130-1. Also, the upper surface S3 of the first barrier metal layer 115a-1 and the upper surface S2 of the first Cu pad 110a-1 may be on the same level as an upper surface S4 of the first polymer layer 130-1. A structure of the first wafer 100a-1, which may be formed prior to a bonding structure, may be completed by forming the first polymer layer 130-1.

As described with reference to FIG. 2B, in some embodiments, although the upper portion of the first polymer material layer 130a-1 may be removed through the developing process, the upper surface S3 of the first barrier metal layer 115a-1 and the upper surface S2 of the first Cu pad 110a-1 may not be exposed. The upper surface S3 of the first barrier metal layer 115a-1 and the upper surface S2 of the first Cu pad 110a-1 may be exposed by subsequent exposing and developing processes. Accordingly, as shown in FIG. 3, in some embodiments, an upper surface of the first polymer layer 130a-1 may be at a higher level than the upper surface S3 of the first barrier metal layer 115a-1 and the upper surface S2 of the first Cu pad 110a-1. However, as described above, in some embodiments, the structure of FIG. 3 may be formed by performing the exposing and developing processes without performing an initial developing process.

Figure 5H:
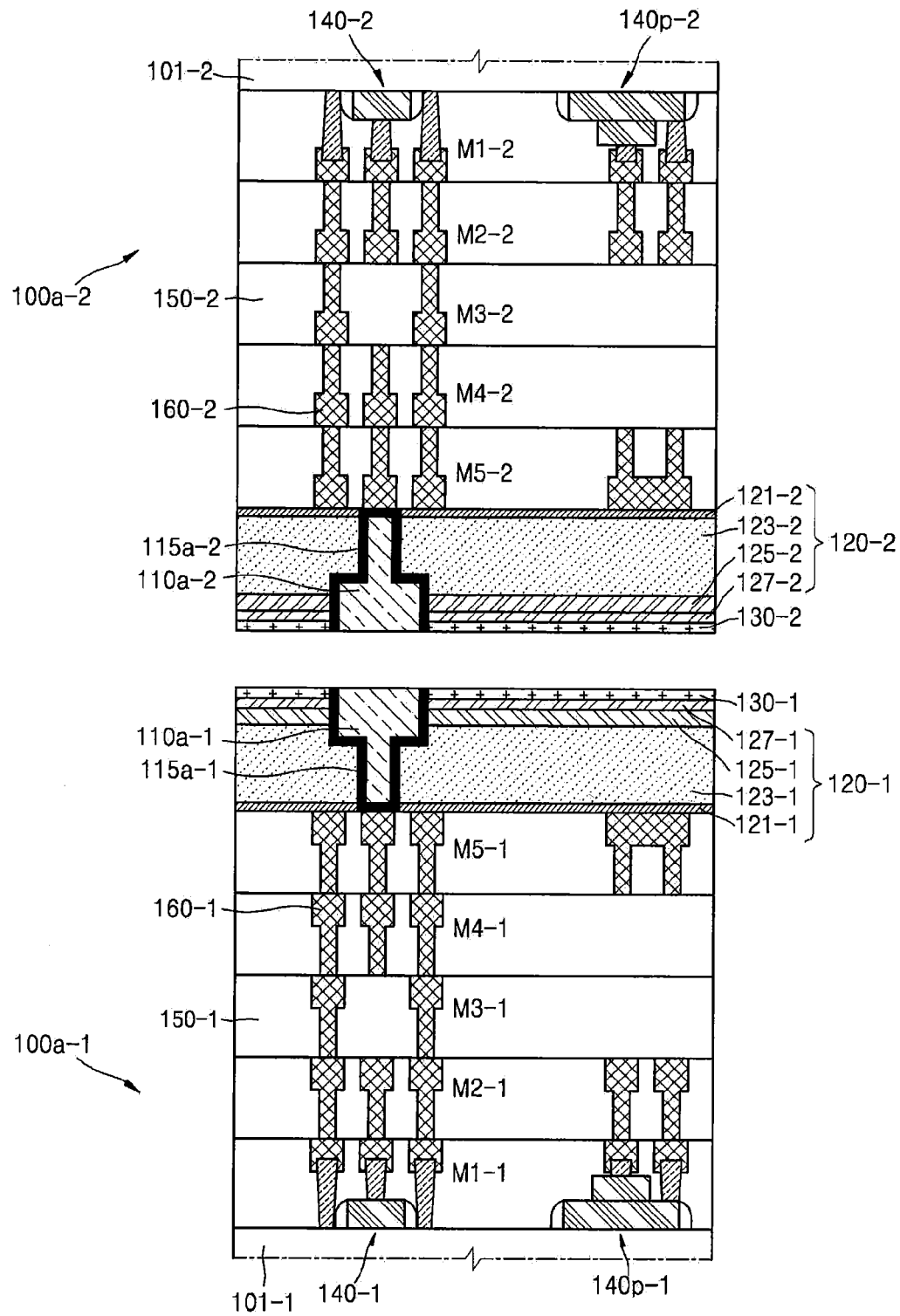

Referring to FIG. 5H, a second wafer 100a-2 may be formed to have the same structure as or a similar structure to the first wafer 100a-1. Also, as shown in FIG. 5H, the second wafer 100a-2 may be arranged so that the first Cu pad 110a-1 faces the second Cu pad 110a-2, and a location of the second wafer 100a-2 may need to be accurate. In other words, an upper surface of the first Cu pad 110a-1 may need to be accurately consistent with that of the second Cu pad 110a-2. The first Cu pad 110a-1 and the second Cu pad 110a-2, the first barrier metal layer 115a-1 and the second barrier metal layer 115a-2, and the first polymer layer 130-1 and the second polymer layer 130-2 may be bonded through a thermal treatment to bond the first wafer 100a-1 and the second wafer 100a-2 to each other to form the wafer-to-wafer bonding structure 1000a having the structure of FIG. 4.

Figure 6:
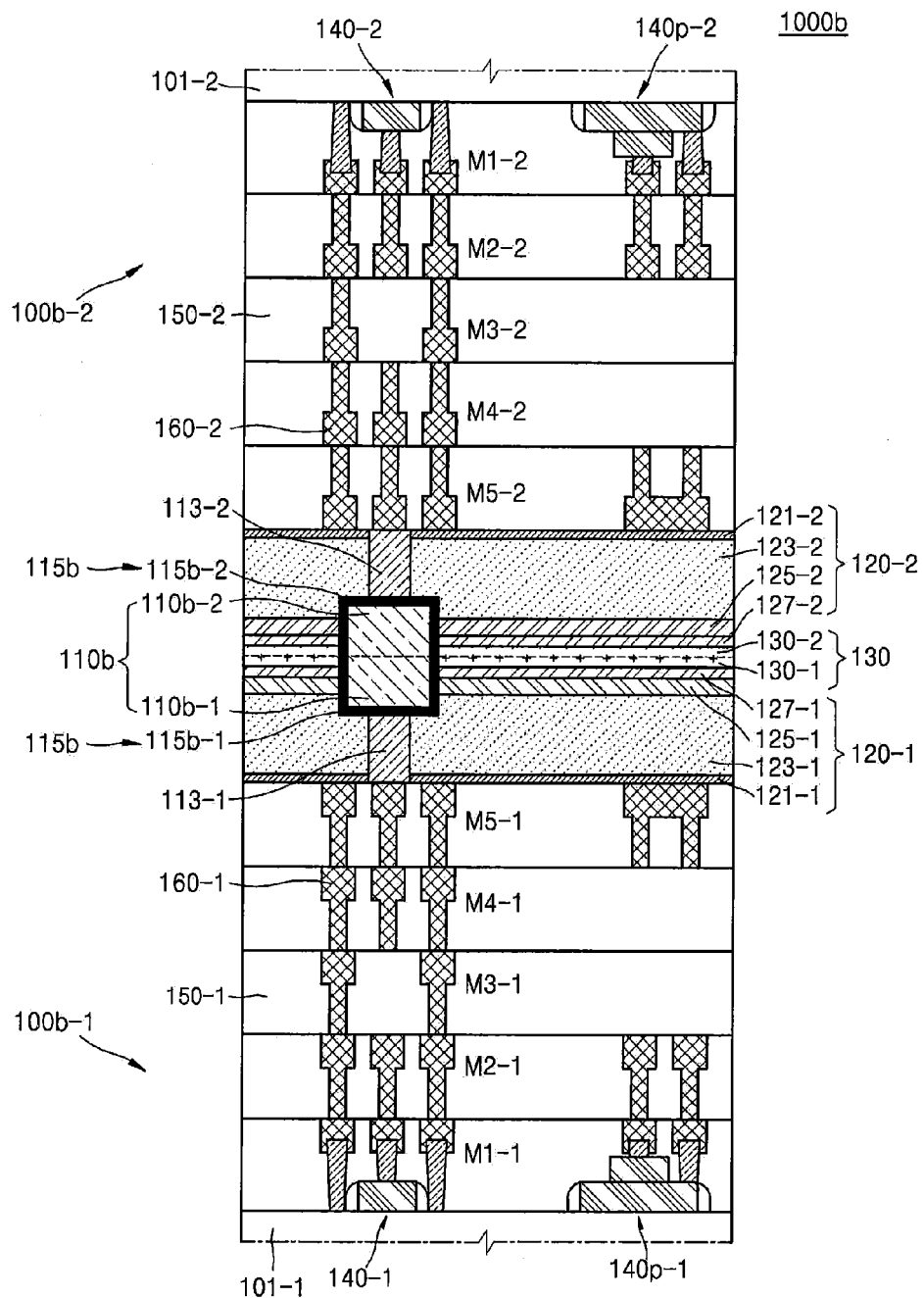
FIG. 6 is a cross-sectional view illustrating a wafer-to-wafer bonding structure according to some embodiments of the inventive concepts.

FIG. 6 is a cross-sectional view illustrating a wafer-to-wafer bonding structure 1000b according to some embodiments of the inventive concepts and may be a modified example of the wafer-to-wafer bonding structure 1000a of FIG. 4.

Referring to FIG. 6, in the wafer-to-wafer bonding structure 1000b, structures of the Cu pad 110b and the barrier metal layer 115b may be different from those in the wafer-to-wafer bonding structure 1000a of FIG. 4. For example, the Cu pad 110b of the wafer-to-wafer bonding structure 1000b may have the same structure as the Cu pad 110 of the wafer-to-wafer bonding structure 1000 of FIG. 1, wherein, in the structure of the Cu pad 110b, a width of a lower portion may be the same as that of an upper portion. Also, the barrier metal layer 115 may cover a lower portion and sides of the Cu pad 110b. Since widths and/or spaces of the Cu pad 110b and the barrier metal layer 115 may not classified into small portions and large portions, the Cu pad 110b and the barrier metal layer 115 may be formed by performing a single damascene process.

The wafer-to-wafer bonding structure 1000b may include a first vertical contact 113-1 and/or a second vertical contact 113-2. The first vertical contact 113-1 may electrically connect the uppermost wiring layer M5-1 of the first multilayer wiring structure 160-1 of the first wafer 100b-1 to the first barrier metal layer 115b-1, and the second vertical contact 113-2 may electrically connect the uppermost wiring layer M5-2 of the second multilayer wiring structure 160-2 of the second wafer 100b-2 to the second barrier metal layer 115b-2. Therefore, the first Cu pad 110b-1 may be electrically connected to the first multilayer wiring structure 160-1 through the first barrier metal layer 115b-1 and the first vertical contact 113-1, and the second Cu pad 110b-2 may be electrically connected to the second multilayer wiring structure 160-2 through the second barrier metal layer 115b-2 and the second vertical contact 113-2.

Descriptions of other components described with reference to FIG. 4 may be omitted.

Figure 7:
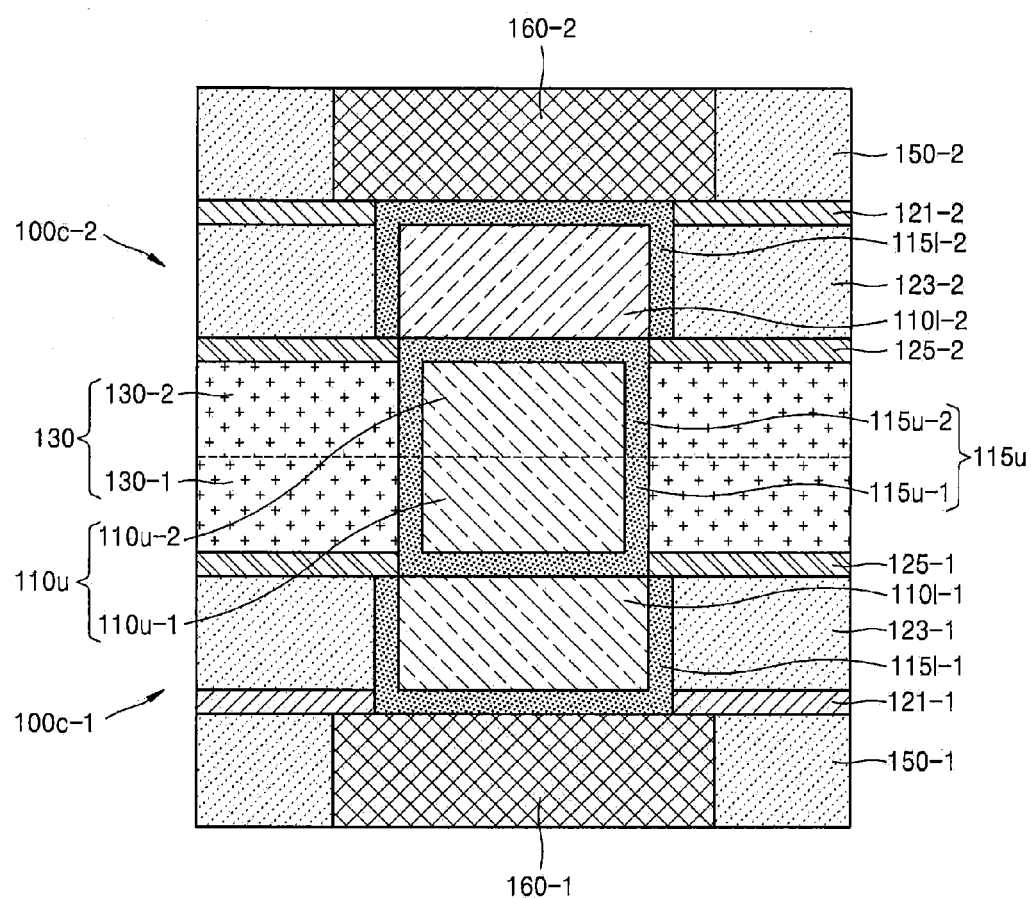
FIG. 7 is a schematic cross-sectional view illustrating a wafer-to-wafer bonding structure according to some embodiments of the inventive concepts.

FIG. 7 is a schematic cross-sectional view illustrating a wafer-to-wafer bonding structure 1000c according to some embodiments of the inventive concepts. Descriptions that are also provided with reference to FIGS. 1 to 6 may be briefly provided and/or omitted for convenience.

Referring to FIG. 7, the wafer-to-wafer bonding structure 1000c may have a bonding structure in which a first wafer 100c-1 and a second wafer 100c-2 may be bonded to each other. Also, in some embodiments, the first wafer 100c-1 may have the same structure as the second wafer 100c-2. Accordingly, hereinafter, only the structure of the first wafer 100c-1 may be described.

The first wafer 100c-1 may include a first interlayer insulating layer 150-1, a first multilayer wiring structure 160-1, a first lowermost insulating layer 121-1, a first lower insulating layer 123-1, a first intermediate insulating layer 125-1, first Cu pads 110l-1 and 110u-1, the first barrier metal layers 115l-1 and 115u-1, and a first polymer layer 130-1. The first interlayer insulating layer 150-1 and the first multilayer wiring structure 160-1 may correspond to uppermost portions of the first interlayer insulating layer 150-1 and the first multilayer wiring structure 160-1 in the wafer-to-wafer bonding structure 1000a of FIG. 4. For example, the first multilayer wiring structure 160-1 may correspond to the uppermost wiring layer M5-1 of the first multilayer wiring structure 160-1 of FIG. 4.

In addition, the first lowermost insulating layer 121-1, the first lower insulating layer 123-1 and the first intermediate insulating layer 125-1 may respectively correspond to the lowermost insulating layer 121-1, the lower insulating layer 123-1, and the intermediate insulating layer 125-1 of FIG. 4. Therefore, in some embodiments, the first lowermost insulating layer 121-1 may be formed as a SiCN layer, the first lower insulating layer 123-1 may be formed as a TEOS layer, and the first intermediate insulating layer 125-1 may be formed as a SiCN layer. In some embodiments, one or more of the first lowermost insulating layer 121-1 and the first intermediate insulating layer 125-1 may be formed as a SiO2 layer. In the wafer-to-wafer bonding structure 1000c, a layer corresponding to the upper insulating layer 127-1 of FIG. 4 may not exist.

The first Cu pads 110l-1 and 110u-1 may be classified into a first lower Cu pad 110l-1 and a first upper Cu pad 110u-1. The first lower Cu pad 110l-1 may be formed by a damascene process, and the first upper Cu pad 110u-1 may be formed by using a polymer-material-layer pattern (130a-1 of FIG. 8E). In some embodiments, a width of the first lower Cu pad 110l-1 may be greater than a width of the first upper Cu pad 110u-1. However, in some embodiments, the width of the first lower Cu pad 110l-1 may be smaller than that of the first upper Cu pad 110u-1. The widths of the first lower Cu pad 110l-1 and the first upper Cu pad 110u-1 may be determined according to a size of the polymer-material-layer pattern used to form the first upper Cu pad 110u-1, as described with reference to FIGS. 8A through 8I.

The first barrier metal layers 115l-1 and 115u-1 may be classified into a first lower barrier metal layer 115l-1 and a first upper barrier metal layer 115u-1. The first lower barrier metal layer 115l-1 may cover a lower surface and sides of the first lower Cu pad 110l-1, and the first upper barrier metal layer 115u-1 may cover a lower surface and sides of the first upper Cu pad 110u-1. As shown in FIG. 7, portions of sides of the first lower barrier metal layer 115l-1 may be covered by the first lower insulating layer 123-1, and portions of sides of the first upper barrier metal layer 115u-1 may be covered by the first polymer layer 130-1.

The first polymer layer 130-1 may be formed on the first intermediate insulating layer 125-1 and may cover the portions of the sides of the first upper barrier metal layer 115u-1 as described above. An upper surface of the first polymer layer 130-1 may be on the same level as upper surfaces of the first upper Cu pad 110u-1 and the first upper barrier metal layer 115u-1.

The first upper Cu pad 110u-1 may be bonded to a second upper Cu layer 110u-2 of the second wafer 100c-2, and the first upper barrier metal layer 115u-1 may be bonded to a second upper barrier metal layer 115u-2 of the second wafer 100c-2. The first polymer layer 130-1 may be bonded to a second polymer layer 130-2 of the second wafer 100c-2. Accordingly, an integrated upper Cu pad 110u, an integrated upper barrier metal layer 115u, and an integrated polymer layer 130 may be respectively formed.

FIGS. 8A through 8I are cross-sectional views illustrating intermediate process operations in methods for fabricating the wafer-to-wafer bonding structure 1000c of FIG. 7 according to some embodiments of the inventive concepts.

Figure 8A:
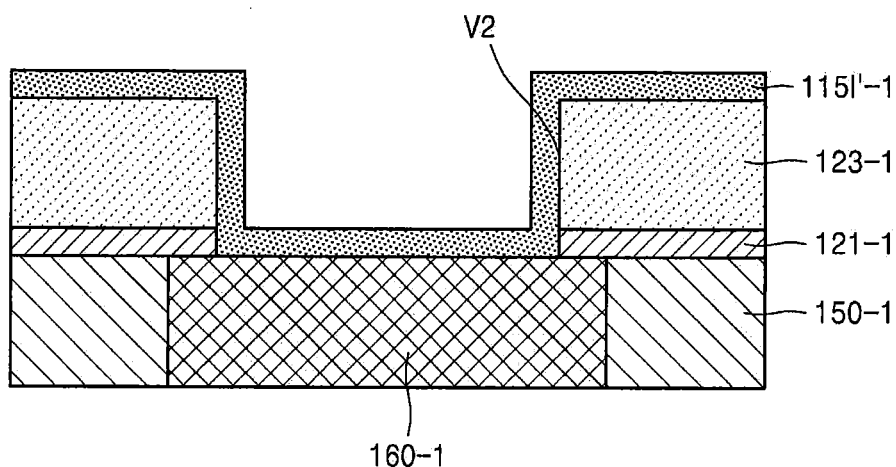
FIGS. 8A through 8I are cross-sectional views illustrating intermediate process operations in methods for fabricating the wafer-to-wafer bonding structure of FIG. 7 according to some embodiments of the inventive concepts.

Referring to FIG. 8A, a first lowermost insulating layer 121-1 and a first lower insulating layer 123-1 may be sequentially formed on the first interlayer insulating layer 150-1 and the first multilayer wiring structure 160-1. For example, in some embodiments, the first lowermost insulating layer 121-1 may be formed as a SiCN layer or a SiO2 layer, and the first lower insulating layer 123-1 may be formed as a TEOS layer. However, materials of the first lowermost insulating layer 121-1 and the first lower insulating layer 123-1 are not limited thereto.

A via V2 may be formed through the first lowermost insulating layer 121-1 and the first lower insulating layer 123-1 to expose an upper surface of the first multilayer wiring structure 160-1. A first lower barrier metal layer 115l'-1 may be formed to cover an inside of the via V2 and the first lower insulating layer 123-1. The first lower barrier metal layer 115l'-1 may have a single-layer structure formed, for example, of one material selected from the group consisting of Ti, Ta, TiN, and TaN or may have a stack structure in which, for example, at least two materials selected from the group consisting of Ti, Ta, TiN, and Tan are stacked.

Figure 8B:
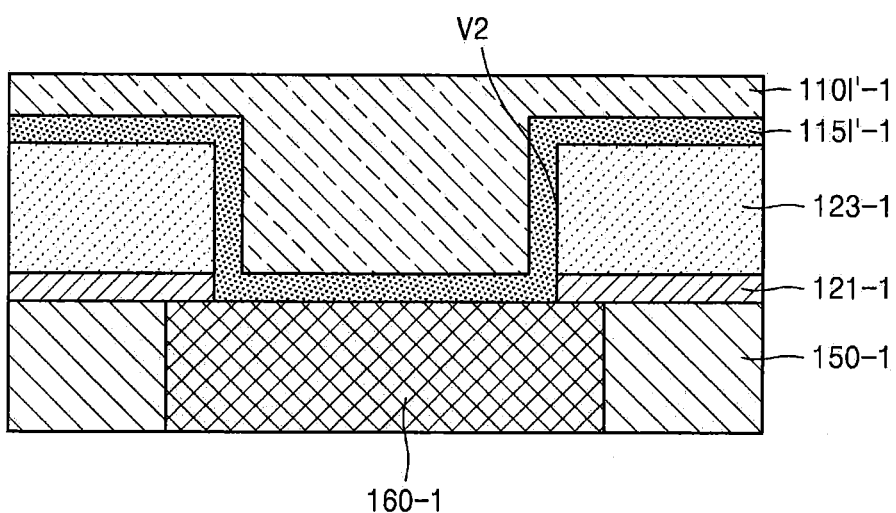
Figure 8C:
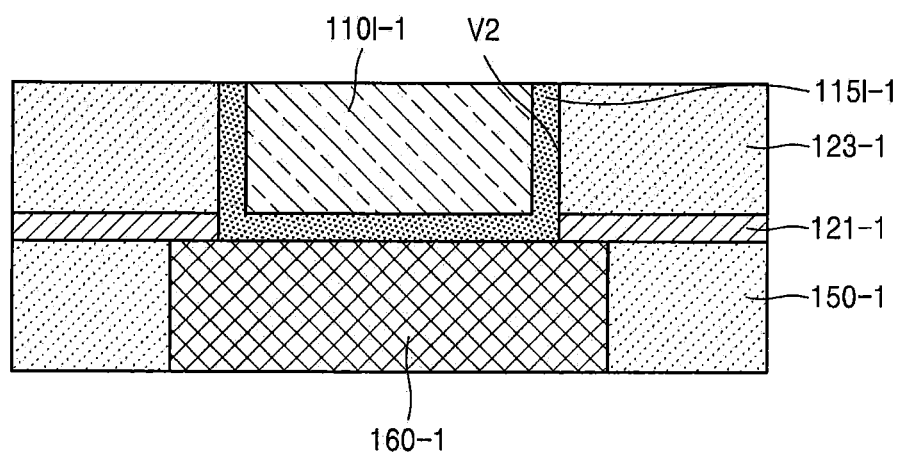

Referring to FIGS. 8B and 8C, a first lower Cu layer 110l'-1 may be formed on the first lower barrier metal layer 115l'-1. The first lower Cu layer 110l'-1 may be formed, for example, by PVD and/or plating. The first lower Cu layer 110l'-1 may completely bury the via V2.

Portions of upper surfaces of the first lower Cu layer 110*l*'-1 and the first lower barrier metal layer 115*l*'-1 may be removed and planarized through, for example, CMP until the upper surface of the first lower insulating layer 123-1 may be exposed to form the first lower barrier metal layer 115*l*-1 and the first lower Cu pad 110*l*-1 in the via V2. Based on the CMP, the upper surfaces of the first lower barrier metal layer 115*l*-1 and the first lower Cu pad 110*l*-1 may be on the same level as the upper surface of the first lower insulating layer 123-1.

Figure 8D:
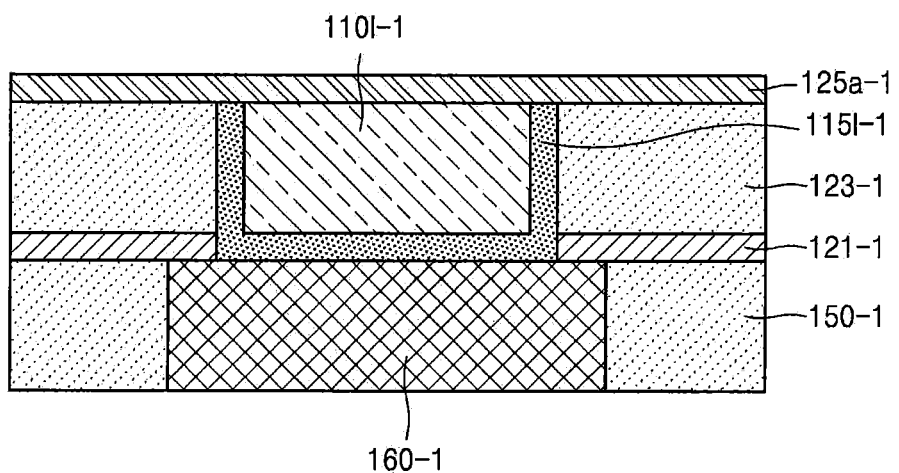

Referring to FIG. 8D, a first intermediate insulating layer 125*a*-1 may be formed on the first lower insulating layer 123-1, the first lower barrier metal layer 115*l*-1, and the first lower Cu pad 110*l*-1. The first intermediate insulating layer 125*a*-1 may be formed as, for example, a SiCN layer and/or a SiO2 layer. However, a material of the first intermediate insulating layer 125*a*-1 is not limited thereto.

Figure 8E:
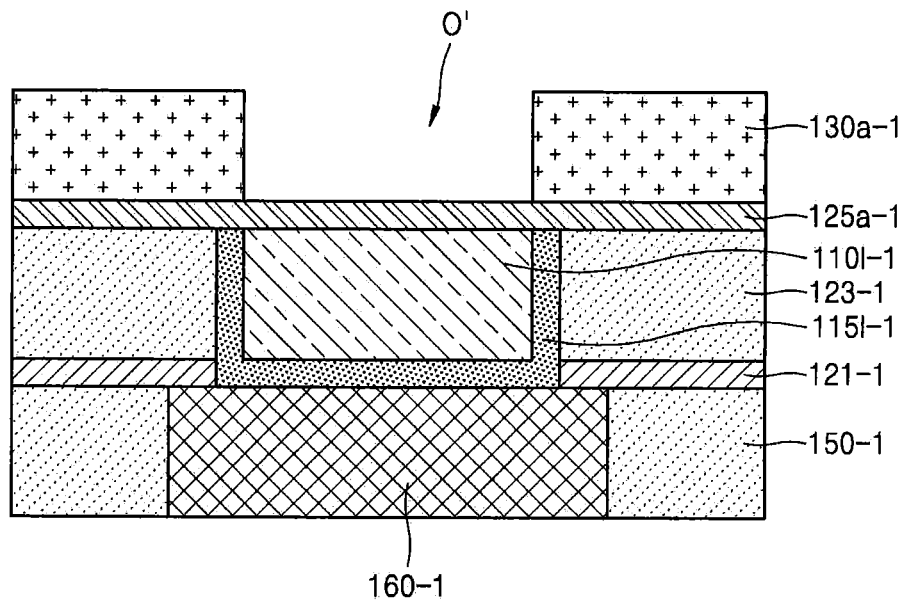

Referring to FIG. 8E, a polymer material layer may be formed on the first intermediate insulating layer 125*a*-1. The polymer material layer may have the same characteristics as the polymer layer 130 and/or the first polymer layer 130-1 of FIG. 1. Accordingly, the polymer material layer may be partially etched by performing a developing process. Portions of the polymer material layer may be completely removed by exposing and developing processes.

A first polymer material-layer pattern 130*a*-1 including an open area O', which exposes a predetermined portion of the first intermediate insulating layer 125*a*-1, may be formed by the exposing and developing processes. The open area O' may correspond to a location where the first lower barrier metal layer 115*l*-1 and the first lower Cu pad 110*l*-1 may be disposed. Sizes of the first lower barrier metal layer 115*l*-1 and the first lower Cu pad 110*l*-1 to be formed may be adjusted by adjusting a width of the open area O'. For example, the sizes of the first upper barrier metal layer 115*u*-1 and the first upper Cu pad 110*u*-1 may be smaller than those of the first lower barrier metal layer 115*l*-1 and the first lower Cu pad 110*l*-1 by decreasing the width of the open area O' compared to the width of the first lower barrier metal layer 115*l*-1. On the contrary, the sizes of the first upper barrier metal layer 115*u*-1 and the first upper Cu pad 110*u*-1 may be greater than those of the first lower barrier metal layer 115*l*-1 and the first lower Cu pad 110*l*-1 by increasing the width of the open area O' compared to the width of the first lower barrier metal layer 115*l*-1.

Figure 8F:
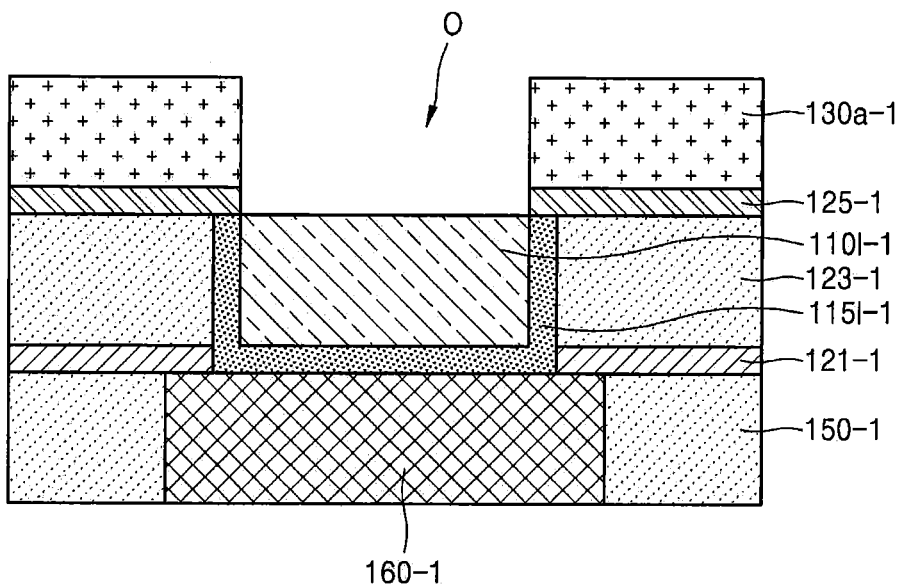

Referring to FIG. 8F, part of the first intermediate insulating layer 125*a*-1 may be etched by using the first polymer material-layer pattern 130*a*-1 as an etching mask. An upper surface of the first lower Cu pad 110*l*-1 may be exposed by etching part of the first intermediate insulating layer 125*a*-1. Therefore, a depth of an open area O may be increased by about a thickness of the first intermediate insulating layer 125-1.

The first intermediate insulating layer 125-1 may cover the upper surface of the first lower barrier metal layer 115*l*-1 but may not cover portions of the first lower Cu pad 110*l*-1. In some embodiments, the first intermediate insulating layer 125-1 may cover the upper surface of the first lower barrier metal layer 115*l*-1 and portions of the upper surface of the first lower insulating layer 123-1.

Figure 8G:
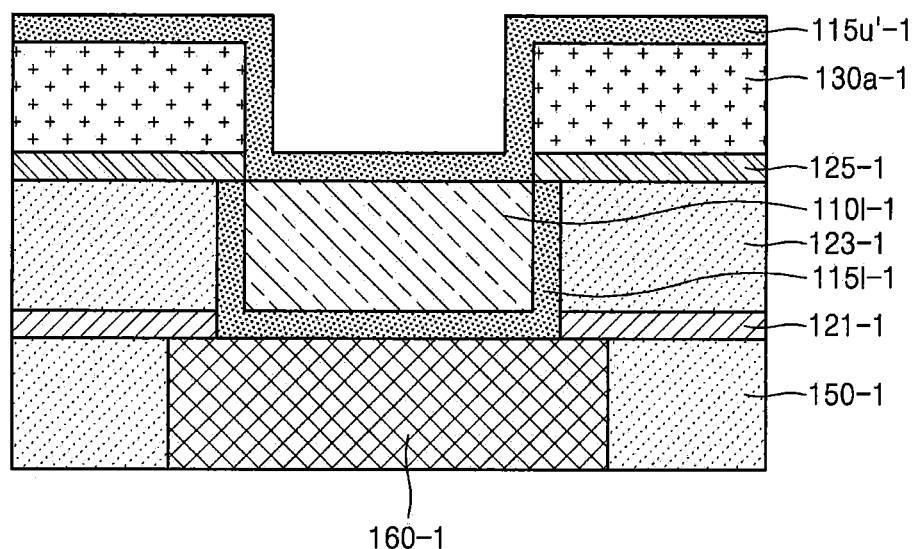
Figure 8H:
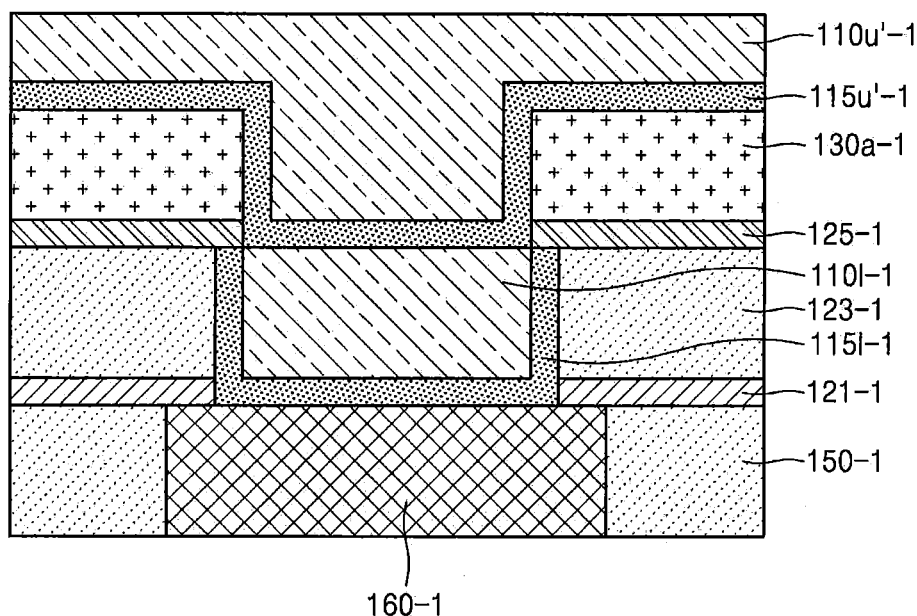
Figure 8I:
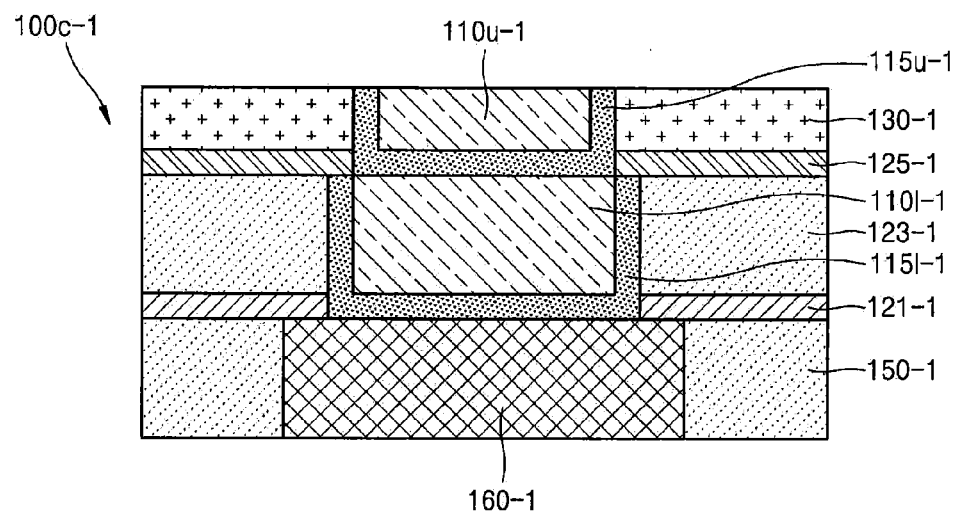

Referring to FIGS. 8G to 8I, a first upper barrier metal layer 115*u*'-1 may be formed to cover the inside of the open area O and an upper surface of the first polymer material-layer pattern 130*a*-1. The first upper barrier metal layer 115*u*'-1 may be formed of the same material and may have the same structure as the first lower barrier metal layer 115*l*-1.

A first upper Cu layer 110*u*'-1 may be formed on the first upper barrier metal layer 115*u*'-1. The first upper Cu layer 110*u*'-1 may be formed, for example, by PVD and/or plating. The first upper Cu layer 110*u*'-1 may completely bury the open area O.

The first polymer layer 130-1 is formed by removing and planarizing portions of the upper surfaces of the first upper Cu layer 110*u*'-1 and the first upper barrier metal layer 115*u*'-1 in order to expose the upper surface of the first polymer material-layer pattern 130*a*-1 through CMP. The first upper barrier metal layer 115*u*-1 and the first upper Cu pad 110*u*-1 may be formed in the open area O through the CMP.

As described above, a thickness of the first polymer layer 130-1 may be smaller than that of the first polymer material-layer pattern 130*a*-1. That is, the upper surface of the first polymer material-layer pattern 130*a*-1 may be removed through CMP. Also, based on CMP, the upper surfaces of the first upper barrier metal layer 115*u*-1 and the first upper Cu pad 110*u*-1 may be on the same level as the upper surface of the first polymer layer 130-1.

The second wafer 100*c*-2 having a similar structure to the structure of the first wafer 100*c*-1 may be prepared, and the first wafer 100*c*-1 and the second wafer 100*c*-2 may be arranged so that the first upper Cu pad 110*u*-1 faces the second upper Cu layer 110*u*'-2. The first upper Cu pad 110*u*-1 and the second upper Cu layer 110*u*'-2, the first upper barrier metal layer 115*u*-1 and the second upper barrier metal layer 115*u*-2, and the first polymer layer 130-1 and the second polymer layer 130-2 may be bonded through a thermal treatment to bond the first wafer 100*c*-1 and the second wafer 100*c*-2 to each other to form the wafer-to-wafer bonding structure 1000*c* of FIG. 7.

Figure 9:
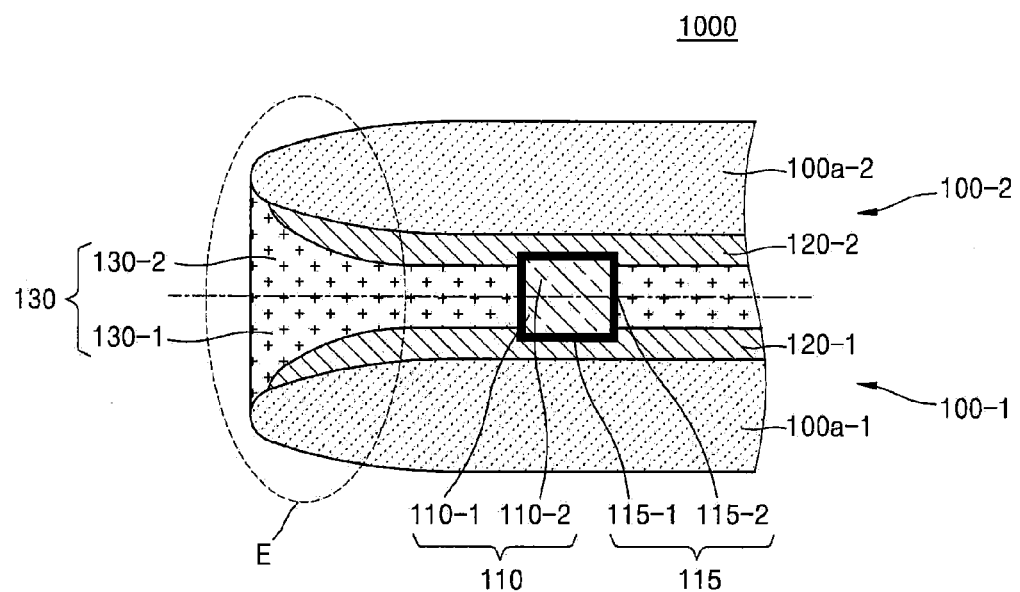
FIG. 9 is a cross-sectional view illustrating edges and/or bevel areas of a wafer-to-wafer bonding structure according to some embodiments of the inventive concepts.

FIG. 9 is a cross-sectional view illustrating edges and/or bevel areas E of the wafer-to-wafer bonding structure 1000 according to some embodiments of the inventive concepts.

Referring to FIG. 9, the wafer-to-wafer bonding structure 1000 of the present embodiment may have a structure in which the first wafer 100-1 and the second wafer 100-2 are bonded to each other. The first wafer 100-1 may include the first substrate structure 100*a*-1, the first insulating layer 120-1, the first barrier metal layer 115-1, the first Cu pad 110-1, and the first polymer layer 130-1. The first polymer layer 130-1 may not be included in the first wafer 100-1 and may be considered as a separate component. Also, the second wafer 100-2 may have substantially the same structure as the first wafer 100-1. The first substrate structure 100*a*-1 may correspond to the first substrate 101-1, the first integrated circuit layers 140-1 and 140*p*-1, the first interlayer insulating layer 150-1, and the first multilayer wiring structure 160-1 of the wafer-to-wafer bonding structure 1000*a* of FIG. 4.

In the wafer-to-wafer bonding structure 1000, the first polymer layer 130-1 and the second polymer layer 130-2 may be respectively formed to the edges and/or bevel areas E of the first wafer 100-1 and the second wafer 100-2. The edges may refer to outer areas of the first and second wafers 100-1 and 100-2, and/or the bevel areas E may refer to curved areas of the edges.

In the wafer-to-wafer bonding structure 1000, the first polymer layer 130-1 and the second polymer layer 130-2 may be respectively formed to the edges and/or the bevel areas E of the first wafer 100-1 and the second wafer 100-2. As the first polymer layer 130-1 and the second polymer layer 130-2 are bonded through the thermal treatment, the bonding force between the first wafer 100-1 and the second wafer 100-2 in the edges and/or the bevel areas E may be reinforced. Accordingly, defects such as cracks and/or separation in edges, which may occur during a subsequent CMP based on bonding defects in the edges of wafers, may be reduced or eliminated.

While the inventive concepts have been particularly shown and described with reference to example embodiments thereof, it will be understood that various changes in form and details may be made therein without departing from the spirit and scope of the following claims.

What is claimed is:

1. A wafer-to-wafer bonding structure comprising:
   a first wafer comprising a first insulating layer on a first substrate and on a first copper (Cu) pad that penetrates the first insulating layer and has portions protruding from an upper surface of the first insulating layer, and a first barrier metal layer on a lower surface and sides of the first Cu pad;
   a second wafer comprising a second insulating layer on a second substrate and on a second copper (Cu) pad that penetrates the second insulating layer, has portions protruding from an upper surface of the second insulating layer, and is bonded to the first Cu pad, and a second barrier metal layer on a lower surface and sides of the second Cu pad; and
   a polymer layer on protruding sides of the first and second barrier metal layers and disposed between the first and second wafers.

2. The wafer-to-wafer bonding structure of claim 1, wherein the polymer layer comprises a first polymer layer on the first wafer and a second polymer layer on the second wafer that are bonded to each other.

3. The wafer-to-wafer bonding structure of claim 1, wherein the polymer layer comprises at least one material selected from the group consisting of polyimide, polyamide, polyacrylate, and polyaramide.

4. The wafer-to-wafer bonding structure of claim 1, wherein the polymer layer has a hardness of 90% or above.

5. The wafer-to-wafer bonding structure of claim 1, wherein the polymer layer is on edges and/or bevel areas, between the first and second wafers.

6. The wafer-to-wafer bonding structure of claim 1,
   wherein the first wafer comprises a first multilayer wiring structure on the first substrate and the second wafer comprises a second multilayer wiring structure on the second substrate,
   wherein the first insulating layer is on the first multilayer wiring structure, and the second insulating layer is on the second multilayer wiring structure, and
   wherein the first Cu pad is electrically connected to the first multilayer wiring structure, and the second Cu pad is electrically connected to the second multilayer wiring structure.

7. The wafer-to-wafer bonding structure of claim 1, wherein the first and second insulating layers respectively comprise a multilayer structure comprising one or more alternately stacked nitride layers and oxide layers.

8. The wafer-to-wafer bonding structure of claim 1, wherein at least one of the first and second insulating layers comprises a first silicon carbon nitride (SiCN) layer, a first tetraethyl orthosilicate (TEOS) layer, and a second SiCN layer that are sequentially stacked.

9. The wafer-to-wafer bonding structure of claim 8, wherein the at least one of the first and second insulating layers further comprises a second TEOS layer on the second SiCN layer.

10. The wafer-to-wafer bonding structure of claim 1,
    wherein the first Cu pad comprises a first upper Cu pad and a first lower Cu pad,
    wherein the second Cu pad comprises a second upper Cu pad and a second lower Cu pad,
    wherein the first barrier metal layer comprises a first lower barrier metal layer on a lower surface and sides of the first lower Cu pad and a first upper barrier metal layer on a lower surface and sides of the first upper Cu pad, and
    wherein the second barrier metal layer comprises a second lower barrier metal layer on a lower surface and sides of the second lower Cu pad and a second upper barrier metal layer on a lower surface and sides of the second upper Cu pad.

11. The wafer-to-wafer bonding structure of claim 10, wherein the polymer layer is on portions of sides of the first and second upper barrier metal layers.

12. A wafer-to-wafer bonding structure comprising:
    a first substrate;
    a first multilayer wiring structure on the first substrate;
    a first insulating layer on the first multilayer wiring structure;
    a polymer layer on the first insulating layer;
    a second insulating layer on the polymer layer;
    a second multilayer wiring structure on the second insulating layer;
    a second substrate on the second multilayer wiring structure;
    a copper (Cu) pad that penetrates the first insulating layer, the polymer layer, and the second insulating layer; and
    barrier metal layers between the Cu pad and the first insulating layer, the polymer layer, and the second insulating layer.

13. The wafer-to-wafer bonding structure of claim 12,
    wherein sides of the barrier metal layers are on sides of the Cu pad, and
    wherein the polymer layer is on portions of the sides of the barrier metal layers.

14. The wafer-to-wafer bonding structure of claim 12,
    wherein the barrier metal layers are on lower and upper surfaces of the Cu pad, and
    wherein the Cu pad is electrically connected to the first multilayer wiring structure through a first of the barrier metal layers on the lower surface of the Cu pad and is electrically connected to the second multilayer wiring structure through a second of the barrier metal layers on the upper surface of the Cu pad.

15. The wafer-to-wafer bonding structure of claim 12,
    wherein the Cu pad comprises a lower Cu pad having a first width, an intermediate Cu pad having a second width, and an upper Cu pad having a third width,
    wherein the barrier metal layers comprise a lower barrier metal layer on portions of the lower Cu pad, intermediate barrier metal layers on portions of the intermediate Cu pad, and an upper barrier metal layer on portions of the upper Cu pad, and
    wherein the polymer layer is on the intermediate barrier metal layers on portions of sides of the intermediate Cu pad.

16. A wafer-to-wafer bonding structure comprising:
    a first substrate;
    a first interlayer insulating layer on the first substrate and comprising a first wiring structure;
    a first nitride layer on the first interlayer insulating layer;
    a first oxide layer on the first nitride layer;
    a second nitride layer on the first oxide layer;

a polymer layer on the second nitride layer and configured to provide a bonding force;
a third nitride layer on the polymer layer;
a second oxide layer on the third nitride layer;
a fourth nitride layer on the second oxide layer;
a second interlayer insulating layer on the fourth nitride layer and comprising a second wiring structure;
a second substrate on the second interlayer insulating layer;
a copper (Cu) pad extending within the second nitride layer, the polymer layer, and the third nitride layer and electrically connected to the first wiring structure and the second wiring structure; and
a barrier metal layer between the Cu pad and the second nitride layer, the polymer layer, and the third nitride layer.

17. The wafer-to-wafer bonding structure of claim 16 wherein the polymer layer comprises a polymer that is configured to bond to another polymer layer, reflow, and crystallize at a temperature of a copper bonding thermal treatment.

18. The wafer-to-wafer bonding structure of claim 16, further comprising:
a third oxide layer between the second nitride layer and the polymer layer; and
a fourth oxide layer between the polymer layer and the third nitride layer,
wherein a bottom surface of the Cu pad is within the first oxide layer, and
wherein a top surface of the Cu pad is within the second oxide layer.

19. The wafer-to-wafer bonding structure of claim 16, wherein the Cu pad comprises a first portion comprising a first width within the polymer layer, a second portion comprising a second width smaller than the first width between the first portion of the Cu pad and the first wiring structure, and a third portion comprising a third width smaller than the first width between the first portion of the Cu pad and the second wiring structure, and
wherein bottom and top surfaces of the barrier metal layer contact respective portions of the first and second wiring structures.

20. The wafer-to-wafer bonding structure of claim 16, wherein the Cu pad is a first Cu pad and the barrier metal layer is a first barrier metal layer, the wafer-to-wafer bonding structure further comprising:
a second Cu pad extending between the first wiring structure and a portion of the barrier metal layer on a bottom surface of the first Cu pad;
a second barrier metal layer on sides and a bottom surface of the second Cu pad adjacent the first wiring structure;
a third Cu pad extending between the second wiring structure and a portion of the barrier metal layer on a top surface of the first Cu pad; and
a third barrier metal layer on sides and a top surface of the third Cu pad adjacent the second wiring structure.

* * * * *